US012462758B2

(12) United States Patent
Zhao et al.

(10) Patent No.: US 12,462,758 B2
(45) Date of Patent: Nov. 4, 2025

(54) GRID-DRIVING-CIRCUIT ARRAY AND DISPLAY PANEL

(71) Applicant: BOE Technology Group Co., Ltd., Beijing (CN)

(72) Inventors: Donghui Zhao, Beijing (CN); Pan Xu, Beijing (CN); Ying Han, Beijing (CN); Xing Zhang, Beijing (CN); Chengyuan Luo, Beijing (CN); Guangshuang Lv, Beijing (CN); Cheng Xu, Beijing (CN); Hongli Wang, Beijing (CN); Tong Wu, Beijing (CN); Dandan Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/579,920

(22) PCT Filed: Mar. 31, 2023

(86) PCT No.: PCT/CN2023/085635
§ 371 (c)(1),
(2) Date: Jan. 17, 2024

(87) PCT Pub. No.: WO2024/197870
PCT Pub. Date: Oct. 3, 2024

(65) Prior Publication Data
US 2025/0078762 A1 Mar. 6, 2025

(51) Int. Cl.
*G09G 3/3258* (2016.01)
*G09G 3/3266* (2016.01)
*G11C 19/28* (2006.01)

(52) U.S. Cl.
CPC ......... *G09G 3/3258* (2013.01); *G09G 3/3266* (2013.01); *G09G 2300/0426* (2013.01);
(Continued)

(58) Field of Classification Search
CPC ............... G09G 3/3258; G09G 3/3266; G09G 2300/0426; G09G 2300/0819;
(Continued)

(56) References Cited

U.S. PATENT DOCUMENTS 5,442,372 A 8/1995 Shiki
11,727,886 B1 8/2023 Li et al.
(Continued)

FOREIGN PATENT DOCUMENTS

CN 1885379 A 12/2006
CN 108109592 A 6/2018
(Continued)

*Primary Examiner* — Tom V Sheng
(74) *Attorney, Agent, or Firm* — WHDA, LLP

(57) ABSTRACT

A grid-driving-circuit array is applied to a display panel, the display panel is delimited into a plurality of active areas, and each of the active areas includes multiple rows of pixel units and multiple rows of grid lines. The multiple groups of grid driving units supply grid driving signals to the plurality of active areas, and each of the groups of grid driving units includes one or more grid driving circuits. The one or more grid driving circuits are configured for supplying the grid driving signals to the grid lines within the active area corresponding to the one or more grid driving circuits. One or more multiplexers, wherein each of the multiplexers includes a plurality of frame-starting-up-signal outputting units, each of the frame-starting-up-signal outputting units of the multiplexer is configured for supplying a frame starting-up signal to one of the grid driving circuits.

19 Claims, 11 Drawing Sheets

(52) U.S. Cl.
CPC ............... *G09G 2300/0819* (2013.01); *G09G 2300/0852* (2013.01); *G09G 2300/0861* (2013.01); *G09G 2310/0286* (2013.01); *G09G 2310/0297* (2013.01); *G09G 2310/08* (2013.01); *G11C 19/28* (2013.01)

(58) Field of Classification Search
CPC ... G09G 2300/0852; G09G 2300/0861; G09G 2310/0286; G09G 2310/0297; G09G 2310/08; G11C 19/28
USPC .......................................................... 345/204
See application file for complete search history.

(56) References Cited

U.S. PATENT DOCUMENTS

| | | | | |
|---|---|---|---|---|
| 2007/0040792 | A1* | 2/2007 | Kwag | G09G 3/2092 345/100 |
| 2008/0062072 | A1* | 3/2008 | Yang | G09G 3/2092 345/55 |
| 2016/0111055 | A1* | 4/2016 | Na | G09G 3/3666 345/94 |
| 2016/0148556 | A1* | 5/2016 | Tseng | G09G 3/3677 345/55 |
| 2017/0061855 | A1* | 3/2017 | Tsai | G09G 3/2092 |
| 2018/0158396 | A1* | 6/2018 | Lee | G09G 3/3266 |
| 2019/0146618 | A1* | 5/2019 | Chen | G06F 3/04184 345/173 |
| 2019/0180671 | A1* | 6/2019 | Cheng | G09G 3/3266 |
| 2020/0251066 | A1 | 8/2020 | Hu et al. | |
| 2021/0035519 | A1* | 2/2021 | Tagawa | G09G 3/3688 |
| 2022/0179513 | A1* | 6/2022 | Kim | G06F 3/04164 |
| 2023/0095759 | A1* | 3/2023 | Kim | G06F 3/04166 345/173 |
| 2023/0298537 | A1 | 9/2023 | Kawashima et al. | |
| 2024/0185796 | A1* | 6/2024 | Shan | G09G 3/3266 |
| 2024/0404476 | A1* | 12/2024 | Yuan | G09G 3/20 |

FOREIGN PATENT DOCUMENTS

| | | | |
|---|---|---|---|
| CN | 108231029 | A | 6/2018 |
| CN | 109686333 | A | 4/2019 |
| CN | 111369952 | A | 7/2020 |
| CN | 115064122 | A | 9/2022 |
| CN | 115273726 | A | 11/2022 |
| KR | 20190108415 | A | 9/2019 |
| WO | 2022/237095 | A1 | 11/2022 |

* cited by examiner

GRID-DRIVING-CIRCUIT ARRAY AND DISPLAY PANEL

TECHNICAL FIELD

The present disclosure relates to the technical field of displaying, and particularly relates to a grid-driving-circuit array and a display panel.

BACKGROUND

Currently, the pixel densities (Pixels Per Inch, PPI) of display panels are increasingly higher, and required grid driving circuits are increasingly more accordingly. Therefore, the room on the display panels for the fabrication of the grid driving circuits decreases.

Taking 3D displaying as an example, in 3D displaying, the existing displaying pixel groups are divided into a plurality of pixel units, and the pixel units display object information from different angles in cooperation with microlenses, to realize 3D displaying. If the quantity of the pixel units is higher, the effect of the 3D displaying is better. However, if the quantity of the pixel units is higher, it means that the resolution is higher. The super-high PPI increases the row quantity of the grid driving circuits, which means that the room for each of the rows decreases. Therefore, it is required to design a grid driving circuit to be used for higher-PPI display panels.

SUMMARY

The present disclosure aims at solving at least one of the technical problems in the prior art, to provide a grid-driving-circuit array and a display panel.

In the first aspect, an embodiment of the present disclosure provides a grid-driving-circuit array, wherein the grid-driving-circuit array is applied to a display panel, the display panel is delimited into a plurality of active areas, and each of the active areas includes multiple rows of pixel units and multiple rows of grid lines; and the grid-driving-circuit array includes:

multiple groups of grid driving units, wherein the multiple groups of grid driving units supply grid driving signals to the plurality of active areas, and each of the groups of grid driving units includes one or more grid driving circuits; and the one or more grid driving circuits are configured for supplying the grid driving signals to the grid lines within the active area corresponding to the one or more grid driving circuits; and one or more multiplexers, wherein each of the multiplexers includes a plurality of frame-starting-up-signal outputting units, each of the frame-starting-up-signal outputting units of the multiplexer is configured for supplying a frame starting-up signal to one of the grid driving circuits, and the frame starting-up signals of different grid driving circuits in each of the groups of the grid driving units are supplied by the frame-starting-up-signal outputting units in different multiplexers.

Optionally, each of the groups of grid driving units includes two grid driving circuits, and the two grid driving circuits include a first grid driving circuit and a second grid driving circuit, respectively;

for one of the grid driving units and the grid lines within the active area corresponding to the one of the grid driving units, the first grid driving circuit is configured for supplying the grid driving signals to the grid lines located in odd-number rows, and the second grid driving circuit is configured for supplying the grid driving signals to the grid lines located in even-number rows;

the one or more multiplexers include a first multiplexer and a second multiplexer;

each of the frame-starting-up-signal outputting units of the first multiplexer is configured for supplying the frame starting-up signal to one of the first grid driving circuits; and each of the frame-starting-up-signal outputting units of the second multiplexer is configured for supplying the frame starting-up signal to one of the second grid driving circuits.

Optionally, each of the frame-starting-up-signal outputting units in the multiplexer includes signal gating transistors and subregion gating transistors;

control electrodes of the signal gating transistors in the multiplexer are connected to a same first gating signal line, first electrodes of the signal gating transistors are connected to a same reference-voltage signal line, and second electrodes of the signal gating transistors are individually connected to a frame-starting-up-signal terminal of the grid driving circuit corresponding thereto;

control electrodes of the subregion gating transistors in the multiplexer are individually independently connected to second gating signal lines, and first electrodes of the subregion gating transistors are connected to a same driving-voltage signal line; and second electrodes of the subregion gating transistors are individually connected to a frame-starting-up-signal terminal of the grid driving circuit corresponding thereto.

Optionally, if a plurality of multiplexers are provided, for the frame-starting-up-signal outputting units in each multiplexer that supply the frame starting-up signals to the same grid driving unit, control electrodes of the subregion gating transistors therein are connected to a same second gating signal line.

Optionally, the grid-driving-circuit array further includes a substrate, and the multiplexers and the reference-voltage signal lines connected thereto, the first gating signal lines and the driving-voltage signal lines which are connected to the multiplexers are provided on the substrate;

all of the reference-voltage signal line, the first gating signal line and the driving-voltage signal line extend in a row direction, and the reference-voltage signal line, the first gating signal line and the driving-voltage signal line are arranged side by side in a column direction;

the subregion gating transistors are located between the first gating signal line and the driving-voltage signal line; and the signal gating transistors are located between the reference-voltage signal line and the first gating signal line.

Optionally, the subregion gating transistors and the signal gating transistors in each of the frame-starting-up-signal outputting units are arranged correspondingly in the column direction.

Optionally, the subregion gating transistors in each of the frame-starting-up-signal outputting units are arranged sequentially side by side in the row direction; and the signal gating transistors in each of the frame-starting-up-signal outputting units are arranged sequentially side by side in the row direction.

Optionally, a reference-voltage-signal switching line and a first gating-signal switching line are provided on the substrate;

the reference-voltage-signal switching line and the first gating-signal switching line extend in the column direction, and the reference-voltage-signal switching line and the first gating-signal switching line are separated in the row direction;

the reference-voltage-signal switching line is electrically connected to the reference-voltage signal line; and the first gating-signal switching line is electrically connected to the first gating signal line.

Optionally, the substrate further includes a first conductive layer, an inter-layer insulating layer and a second conductive layer that are sequentially arranged in a direction away from the substrate;

the control electrodes of the signal gating transistors, the control electrodes of the subregion gating transistors, the reference-voltage signal line and the first gating signal line are located at the first conductive layer;

the driving-voltage signal line, the reference-voltage-signal switching line and the first gating-signal switching line are located at the second conductive layer;

the reference-voltage-signal switching line is electrically connected to the reference-voltage signal line by a first connecting via hole penetrating the inter-layer insulating layer;

the first gating-signal switching line is electrically connected to the first gating signal line by a second connecting via hole penetrating the inter-layer insulating layer;

the driving-voltage signal line is electrically connected to the first electrode of the subregion gating transistor by a third connecting via hole penetrating the inter-layer insulating layer; and the first electrodes of the subregion gating transistors are connected to the independent third connecting via holes.

Optionally, the first conductive layer further includes second gating-signal switching terminals, and the second gating-signal switching terminals are configured for connecting the control electrodes of the subregion gating transistors to the independent second gating-signal switching terminals, respectively.

Optionally, the second conductive layer further includes frame-starting-up-signal switching lines;

the frame-starting-up-signal switching lines are individually connected to a frame-starting-up-signal terminal of the grid driving circuit corresponding thereto;

the frame-starting-up-signal switching lines extend in the column direction, and the frame-starting-up-signal switching lines are arranged in parallel in the row direction;

the frame-starting-up-signal switching lines are connected to the second electrodes of the signal gating transistors by fourth connecting via holes penetrating the inter-layer insulating layer, and the second electrodes of the signal gating transistors are electrically connected to the frame-starting-up-signal switching lines by the independent fourth connecting via holes; and the frame-starting-up-signal switching lines are connected to the second electrodes of the subregion gating transistors by fifth connecting via holes penetrating the inter-layer insulating layer, and the second electrodes of the subregion gating transistors are electrically connected to the frame-starting-up-signal switching lines by the independent fifth connecting via holes.

Optionally, each of the grid driving circuits includes shift registers that are cascaded;

each of the shift registers includes an initializing unit, a controlling unit, a feedback unit, a cascading unit, an outputting unit, a feedback unit and a voltage regulating unit;

the initializing unit is configured for receiving an initializing signal, and initializing a voltage of a first node;

the controlling unit is configured for, under controlling by the frame starting-up signals and a first level signal, starting-up the shift register, and charging the first node; and under controlling by a resetting signal and a second level signal, resetting the shift register;

the outputting unit is configured for, under controlling by the voltage of the first node and a first clock signal, outputting the grid driving signals;

the cascading unit is configured for, under controlling by the voltage of the first node and a second clock signal, outputting a cascading signal;

the feedback unit is configured for, when the shift register is outputting, under controlling by the voltage of the first node, discharging a second node; and after the outputting of the shift register is completed, under controlling by a third clock signal, charging the second node; and the voltage regulating unit is configured for regulating the voltage of the first node and a voltage of the second node.

Optionally, the controlling unit includes a first transistor and a second transistor;

a control electrode of the first transistor is connected to a frame-starting-up-signal terminal, a first electrode is connected to a first level-signal terminal, and a second electrode is connected to a second electrode of the second transistor and the first node; and a control electrode of the second transistor is connected to a resetting-signal terminal, and a first electrode is connected to a first level-signal terminal.

Optionally, the initializing unit includes a third transistor, a control electrode of the third transistor is connected to an initializing-signal terminal, a first electrode is connected to the first node, and a second electrode is connected to a common-voltage terminal.

Optionally, the feedback unit includes a fourth transistor and a fifth transistor, a first electrode and a control electrode of the fourth transistor are connected to a second clock-signal terminal, and a second electrode of the fourth transistor is connected to the second node and a first electrode of the fifth transistor; and a control electrode of the fifth transistor is connected to the first node, and a second electrode of the fifth transistor is connected to the common-voltage terminal.

Optionally, the voltage regulating unit includes a first-node discharging unit and a second-node discharging unit:

the first-node discharging unit, after outputting of the shift register is completed, under controlling by the voltage of the second node, discharges the first node; and the second-node discharging unit, when the shift register is outputting, discharges the second node.

Optionally, the first-node discharging unit includes a sixth transistor, a control electrode of the sixth transistor is connected to the second node, the second electrode of the fourth transistor and the first electrode of the fifth transistor; a first electrode of the sixth transistor is connected to the first node, and a second electrode of the sixth transistor is connected to a common-voltage terminal; and the second-node discharging unit includes a seventh transistor, a control electrode of the seventh transistor is connected to a cascading-signal terminal, a first electrode of the seventh transistor is connected to the common-voltage terminal, and a second electrode of the seventh transistor is connected to the second node.

Optionally, the cascading unit includes an eighth transistor and a ninth transistor;

a control electrode of the eighth transistor is connected to the first node, a first electrode of the eighth transistor is connected to the second clock-signal terminal, and a second electrode of the eighth transistor is connected to a first electrode of the ninth transistor;

a control electrode of the ninth transistor is connected to the second node, and a second electrode the ninth transistor is connected to a common-voltage terminal; and a connection point of the second electrode of the eighth transistor and the first electrode of the ninth transistor is used as a cascading-signal terminal of the shift register.

Optionally, the outputting unit includes a tenth transistor, an eleventh transistor and a first storage capacitor;

a control electrode of the tenth transistor is connected to the first node and a first electrode of the first storage capacitor, a first electrode of the tenth transistor is connected to a first clock-signal terminal, and a second electrode of the tenth transistor is connected to a first electrode of the eleventh transistor and a second electrode of the first storage capacitor;

a control electrode of the eleventh transistor is connected to the second node, and a second electrode of the eleventh transistor is connected to a common-voltage terminal; and a connection point of a second electrode of the tenth transistor, a first electrode of the eleventh transistor and a second electrode of the first storage capacitor is used as a grid-driving-signal terminal of the shift register.

Optionally, the shift register further includes a correcting unit;

the correcting unit is configured for, under controlling by an enabling-signal terminal, enabling the shift register to output a correction controlling signal;

the correcting unit includes a twelfth transistor and a thirteenth transistor;

a control electrode and a first electrode of the twelfth transistor and the enabling-signal terminal are connected to a control electrode of the thirteenth transistor, and a second electrode of the twelfth transistor is connected to the grid-driving-signal terminal; and a first electrode of the thirteenth transistor is electrically connected to the common-voltage terminal, and a second electrode of the thirteenth transistor is electrically connected to the second node.

Optionally, the shift register further includes a storing unit:

the storing unit is configured for storing the voltage of the second node; and the storing unit includes a second storage capacitor, a first electrode of the second storage capacitor is connected to the second node, and a second electrode of the second storage capacitor is connected to a common-voltage terminal.

Optionally, the voltage regulating unit further includes an auxiliary second-node discharging unit;

the auxiliary second-node discharging unit is configured for, under controlling by a frame-starting-up-signal terminal, discharging the second node; and the auxiliary second-node discharging unit includes a fourteenth transistor, a control electrode of the fourteenth transistor is connected to a frame-starting-up-signal terminal, a first electrode of the fourteenth transistor is connected to the second node, and a second electrode of the fourteenth transistor is connected to a common-voltage terminal.

Optionally, the first clock-signal terminal and the second clock-signal terminal are the same, and are the same signal terminal.

Optionally, the cascading-signal terminal of the shift register of the present stage is connected to a resetting-signal terminal of the shift register of a preceding stage and a frame-starting-up-signal terminal of the shift register of a subsequent stage.

In the second aspect, an embodiment of the present disclosure further provides a display panel, wherein the display panel includes the grid-driving-circuit array according to any one of the above embodiments.

Optionally, the display panel is delimited into a pixel region and a non-pixel region; and the grid driving units and the multiplexers of the grid-driving-circuit array are located within the non-pixel region.

Optionally, the non-pixel region includes a fanning-out trace region located on one side of the pixel region, and the multiplexers are located within the fanning-out trace region.

DETAILED DESCRIPTION

Figure 1:
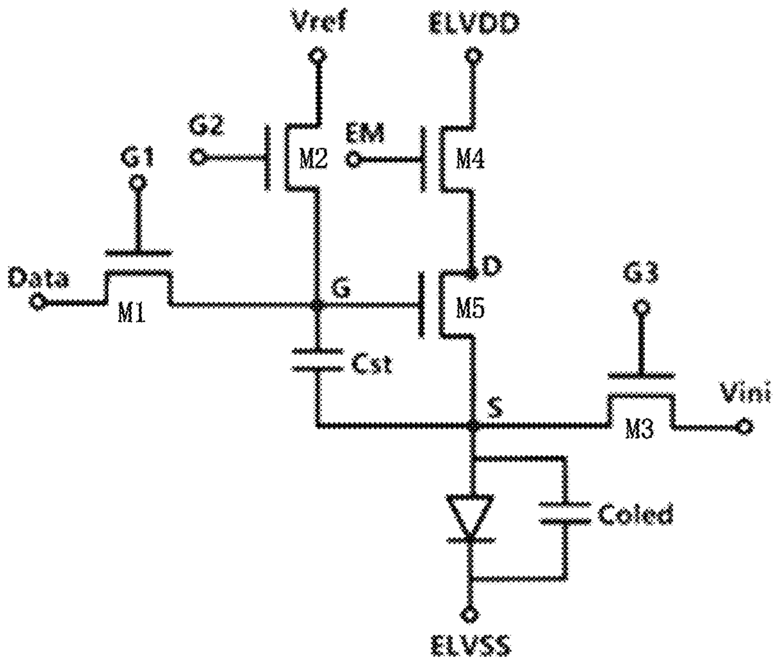
FIG. 1 is a schematic structural diagram of an exemplary pixel driving circuit.

In order to enable a person skilled in the art to comprehend the technical solutions of the present disclosure better, the present disclosure will be further described in detail below with reference to the drawings and the particular embodiments.

Unless defined otherwise, the technical terminologies or scientific terminologies used in the present disclosure should have the meanings generally understood by a person skilled in the art of the present disclosure. The words used herein such as "first" and "second" do not indicate any sequence, quantity or priority, but are merely intended to distinguish different components. Likewise, the words such as "a", "an" or "the" do not indicate quantitative limitations, but indicate the existence of at least one instance. The words such as "comprise" or "include" mean that the element or article preceding the word encompasses the elements or articles and the equivalents thereof that are listed subsequent to the word, but do not exclude other elements or articles. The words such as "connect" or "couple" are not limited to physical or mechanical connections, but may include electric connections, regardless of direct connections or indirect connections. The words such as "upper", "lower", "left" and "right" are merely intended to indicate relative positions, and if the absolute position of the described item has changed, the relative positions might also be correspondingly changed.

The transistors used in the embodiments of the present disclosure may be thin-film transistors, field-effect transistors or the same devices of other characteristics. Because the source and the drain of the used transistors are symmetrical, their source and drain have no difference. In the embodiments of the present disclosure and the description below, in order to distinguish the source and the drain of the transistors, one of them is referred to as the first electrode, the other is referred to as the second electrode, and the grid is referred to as the control electrode. Moreover, according to the characteristics of the transistors, the transistors may be classified into N type and P type. When a P-type transistor is used, the first electrode is the source of the P-type transistor, the second electrode is the drain of the P-type transistor, and when the grid is inputted a low-level signal, the source and the drain are switched on. When an N-type transistor is used, the first electrode is the source of the N-type transistor, the second electrode is the drain of the N-type transistor, and when the grid is inputted a high-level signal, the source and the drain are switched on. The embodiments of the present disclosure and the description below illustrate by taking the case as an example for the description in which the transistors in the pixel circuit are N-type transistors.

Currently, the pixel densities (Pixels Per Inch, PPI) of display panels are increasingly higher, and increasingly more grid driving circuits are required accordingly. Therefore, the room on the display panels for the fabrication of the grid driving circuits decreases. The present disclosure, in view of the above problem, provides a high-PPI display panel with a grid-driving-circuit array, to solve the problem of insufficient room for the fabrication of the grid driving circuits caused by the increased row quantity of the pixel units.

FIG. 1 is a schematic structural diagram of an exemplary pixel driving circuit. As shown in FIG. 1, the pixel circuit includes a data writing transistor M1, a resetting transistor M2, an initializing transistor M3, a light-emission controlling transistor M4, a driving transistor M5, a first capacitor Cst and a second capacitor Coled.

Particularly, the grid of the data writing transistor M1 is connected to the grid-driving-signal terminal G1, the source is connected to a data-signal terminal Data, and the drain is connected to a node G. The grid of the resetting transistor M2 is connected to a second scanning-signal terminal G2, the source is connected to a resetting-signal terminal Vref, and the drain is connected to the grid of the driving transistor M5. The grid of the initializing transistor M3 is connected to a third scanning-signal terminal G3, the source is connected to an initializing-signal terminal Vini, the drain is connected to the source of the driving transistor M5 and the anode of a light emitting device D, and their connection is a connecting node S. The grid of the light-emission controlling transistor M4 is connected to a light-emission controlling-signal terminal EM, the source is connected to a first power-supply-voltage terminal ELVDD, the drain is connected to the source of the driving transistor M5, and their connection is a connecting node D. The grid of the driving transistor M5 is connected to the drain of the data writing transistor M1 and the drain of the resetting transistor M2, the source is connected to the drain of the light-emission controlling transistor M4, and the drain is connected to the anode of the light emitting device D. One terminal of the first capacitor Cst is connected to the grid of the driving transistor M5, and the other terminal is connected to the drain of the driving transistor M5. One terminal of the second capacitor Coled is connected to the anode of the light emitting device D, and the other terminal is connected to the cathode of the light emitting device D. The anode of the light emitting device D is connected to the drain of the driving transistor M5, and the cathode is connected to a second power-supply-voltage terminal ELVSS.

Figure 2:
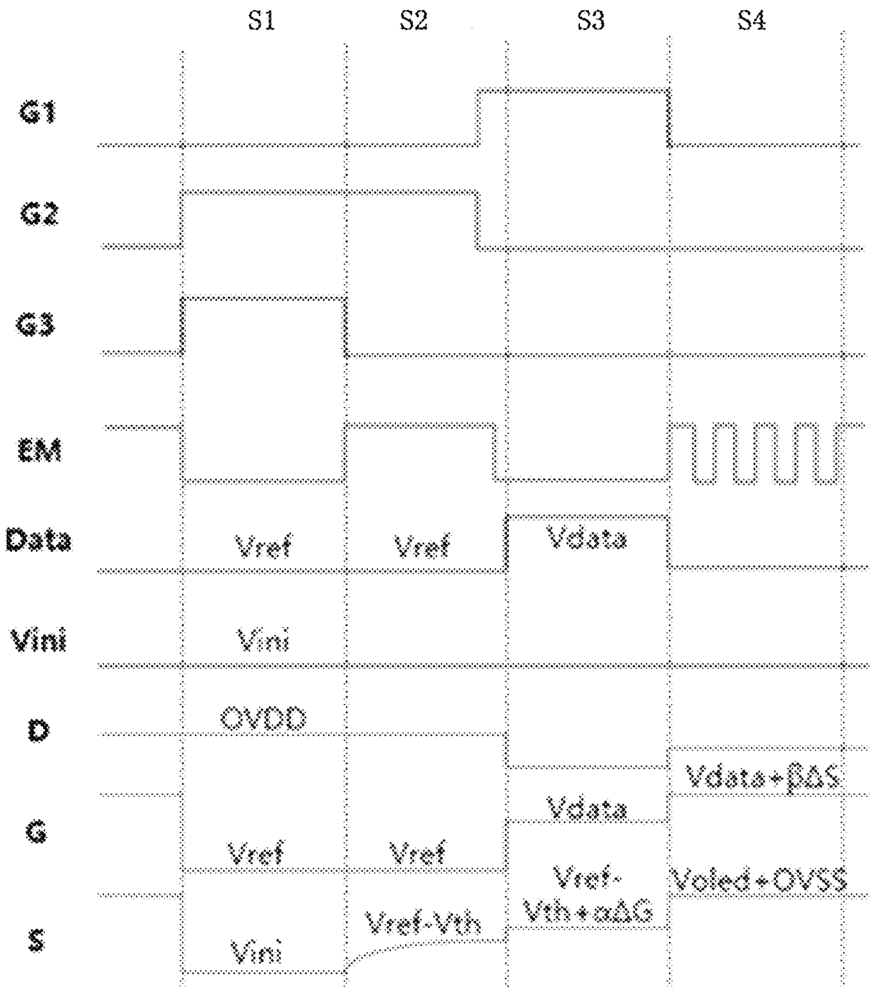
FIG. 2 is a sequence diagram of the pixel driving circuit shown in FIG. 1.

FIG. 2 is a sequence diagram of the pixel driving circuit shown in FIG. 1. As shown in FIG. 2, the entire time sequence may be divided into a resetting stage S1, a compensation stage S2, a data-writing stage S3 and a light-emission stage S4.

At the resetting stage S1, the control electrodes of the resetting transistor M2 and the initializing transistor M3 are connected to high levels, the resetting transistor M2 and the initializing transistor M3 are turned on, the control electrodes of the data writing transistor M1 and the light-emission controlling transistor M4 are connected to low levels, and the data writing transistor M1 and the light-emission controlling transistor M4 are turned off. At this point, the node G and the node S are reset, wherein the voltage of the node G is the input voltage of the resetting-signal terminal Vref, and the voltage of the node S is the input voltage of the initializing-signal terminal Vini.

At the compensation stage S2, the control electrodes of the data writing transistor M1 and the initializing transistor M3 are connected to low levels, the data writing transistor M1 and the initializing transistor M3 are turned off, the control electrodes of the resetting transistor M2 and the light-emission controlling transistor M4 are connected to high levels, and the resetting transistor M2 and the light-emission controlling transistor M4 are turned on. At this point, the voltage of the node S is compensated.

At the data-writing stage S3, the control electrode of the data writing transistor M1 is connected to a high level, the data writing transistor M1 is turned on, the control electrodes of the resetting transistor M2, the initializing transistor M3 and the light-emission controlling transistor M4 are connected to low levels, and the resetting transistor M2, the initializing transistor M3 and the light-emission controlling transistor M4 are turned off. The source of the data writing transistor M1 writes a data signal, wherein the data signal is a voltage signal, and is stored at the first capacitor Cst.

At the light-emission stage S4, the control electrode of the light-emission controlling transistor M4 is connected to a high level, the light-emission controlling transistor M1 is turned on, the control electrodes of the data writing transistor M1, the resetting transistor M2 and the initializing transistor M3 are connected to low levels, and the data writing transistor M1, the resetting transistor M2 and the initializing transistor M3 are turned off. The control electrode of the driving transistor M5 receives the data signal stored at the first capacitor Cst, and is turned on under the controlling by the data signal. At the light-emission stage S4, light regulation may be performed by pulse width modulation (PWM). In other words, the light-emission controlling signal of the light-emission controlling-signal terminal EM is a pulse signal, and the time when the light emitting device D emits light can be regulated by controlling the duty cycle of the light-emission controlling signal, thereby regulating the brightness of the light emitting device D.

It should be noted that, in an embodiment of the present disclosure, the pixel driving circuit may not only be the 5T2C (i.e., five transistors and two capacitors) structure shown in FIG. 1, but also may be a structure including transistors of other quantities, for example, a 7T1C structure, a 7T2C structure, a 6T1C structure, a 6T2C structure and a 9T2C structure, which is not limited in the embodiments of the present disclosure.

It should be noted that the durations of the stages in the sequence diagram of the pixel driving circuit shown in FIG. 2 are merely an example. In practical operations, the duration of the compensation stage S2 is greater than the duration of the resetting stage S1. Furthermore, at the light-emission stage S4, the waveform loaded by the control electrode of the light-emission controlling transistor M4 may also not be an impulse-type waveform, and may maintain at a high-level signal.

The display panel includes multiple rows of pixel units and multiple rows of grid lines, and each of the rows of grid lines supplies a grid driving signal to one of the rows of the pixel units. Each of the pixel units includes a light emitting device and a pixel driving circuit. Referring continuously to FIG. 1, taking the circuit shown in FIG. 1 as an example, the grid line supplies the grid driving signal to the grid-driving-signal terminal G1 in the pixel driving circuit, to supply the voltage to the control electrode of the data writing transistor, thereby realizing the controlling over the pixel driving circuit. The grid driving signal is required to be supplied by the grid driving circuit. Usually the grid driving circuits are provided on the side faces of the display panel, and any one end of each of the rows of pixel units. In higher-PPI display panels, the row quantity of the pixel units increases, which causes that the row spacing decreases, and the room for the fabrication of the grid driving circuits decreases accordingly. Therefore, it is required to configure the grid driving circuits, to reduce the longitudinal (column direction) room that they occupy, to realize the fabrication of the grid driving circuits in a small room.

In view of the above, the embodiments of the present disclosure provide a grid-driving-circuit array. The display panel is delimited into a plurality of active areas, and each of the active areas contains multiple rows of pixel units and multiple rows of grid lines. Each of the rows of grid lines supplies a grid driving signal to one of the rows of the pixel units. Each of the active areas corresponds to one of the grid driving units one to one, and each of the grid driving units includes one or more grid driving circuits. The grid-driving-circuit array further includes one or more multiplexers, wherein each of the multiplexers includes a plurality of frame-starting-up-signal outputting units, and each of the frame-starting-up-signal outputting units supplies a frame starting-up signal to one of the grid driving circuits of one of the grid driving units.

The grid-driving-circuit array according to the embodiments of the present disclosure will be described particularly below with reference to the particular embodiments and the drawings.

Figure 3:
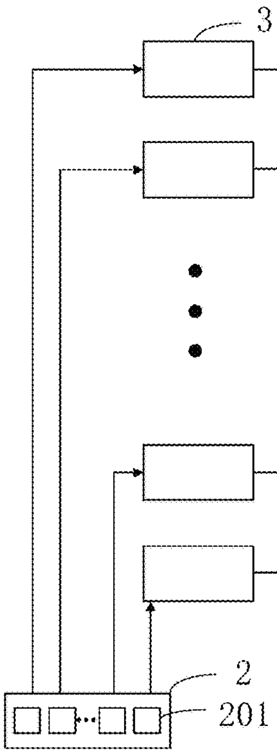
FIG. 3 is a schematic diagram of a grid-driving-circuit array according to the present disclosure.

An embodiment of the present disclosure provides a grid-driving-circuit array. FIG. 3 is a schematic diagram of a grid-driving-circuit array according to the present disclosure. As shown in FIG. 3, the grid-driving-circuit array is applied to a display panel, the display panel is delimited into a plurality of active areas 1, and each of the active areas 1 contains multiple rows of pixel units P and the grid lines 4 corresponding to the multiple rows of pixel units P. The grid-driving-circuit array includes the multiple groups of grid driving units 3 and one or more multiplexers 2. The multiple groups of grid driving units 3 supply grid driving signals to the plurality of active areas 1, and each of the groups of grid driving units 3 includes one or more grid driving circuits. The one or more grid driving circuits are configured for supplying the grid driving signals to the grid lines 4 within the active area 1 corresponding to the one or more grid driving circuits. Each of the multiplexers 2 includes a plurality of frame-starting-up-signal outputting units 201, each of the frame-starting-up-signal outputting units 201 of the multiplexer 2 is configured for supplying a frame starting-up signal to one of the grid driving circuits, and the frame starting-up signals of different grid driving circuits in each of the groups of the grid driving units 3 are supplied by the frame-starting-up-signal outputting units 201 in different multiplexers 2.

In an embodiment of the present disclosure, the display panel is delimited into a plurality of active areas 1 by rows. When the display panel is a large-size display panel or a super-high-pixel-density display panel, the row quantity of its pixel units P is very high. Each of the grid driving circuits includes a plurality of shift registers 301 that are cascaded, and one of the shift registers 301 supplies a grid driving signal to one of the grid lines 4. When the row quantity of the pixel units P is excessively high, one grid driving circuit cannot supply the grid driving signals to all of the grid lines 4. Optionally, because excessively many shift registers 301 are cascaded, the signals have a certain loss, which affects the normal displaying of the display panel. Therefore, the display panel is delimited into a plurality of active areas 1, and each of the active areas 1 corresponds to one of the grid driving units 3, which can realize supplying stable grid driving signals to the grid lines 4 in large-size display panels or super-high-pixel-density display panels, and can realize subregion controlling over the display panel.

It should be noted that one row of the grid lines 4 may control merely all of or some of the pixel units P in one row of the pixel units P, but one row of the pixel units P can be correspondingly controlled by two grid lines 4. For example, one row of the pixel units P are delimited into subregions or odd-even numbers, to be controlled by two or more grid lines 4.

Figure 4:
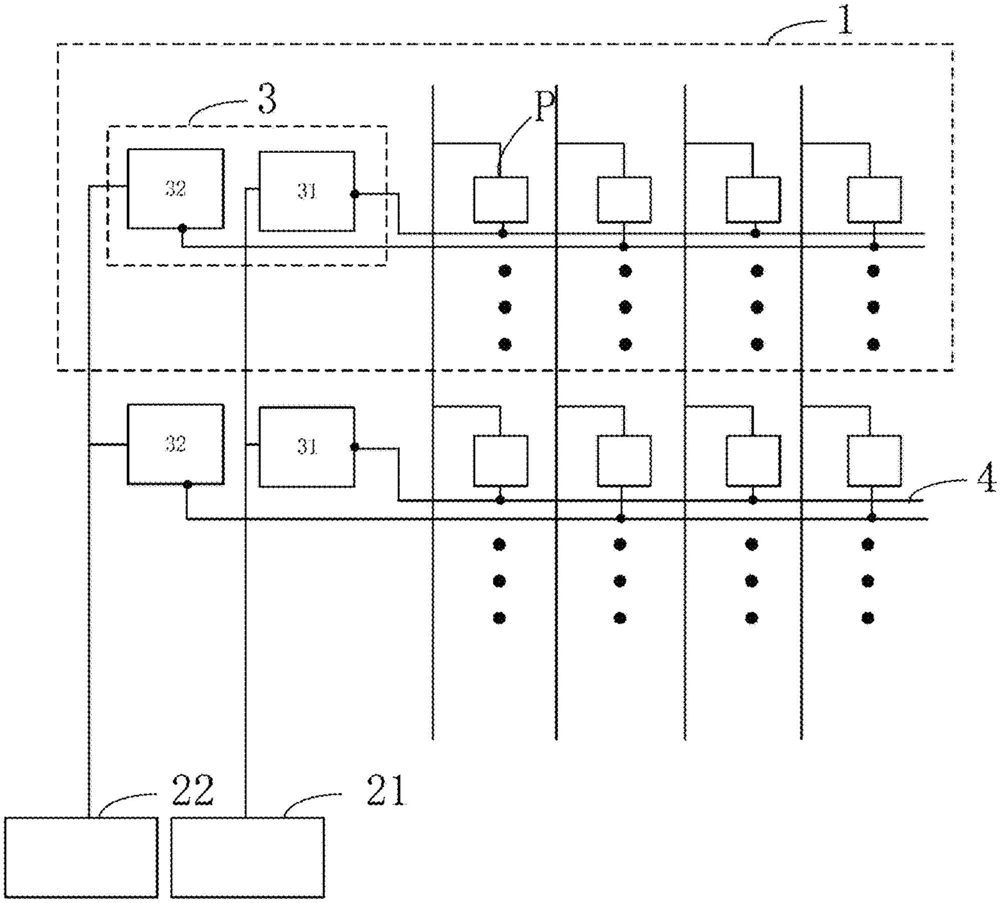
FIG. 4 is a schematic diagram of another grid-driving-circuit array according to the present disclosure.

In some examples, FIG. 4 is a schematic diagram of another grid-driving-circuit array according to the present disclosure. As shown in FIG. 4, each of the groups of grid driving units 3 includes two grid driving circuits, and the two grid driving circuits include a first grid driving circuit 31 and a second grid driving circuit 32. For one of the grid driving units 3 and the grid lines 4 within the active area 1 corresponding to the one of the grid driving units 3, the first grid driving circuit 31 is configured for supplying the grid driving signals to the grid lines 4 located in the odd-number rows, and the second grid driving circuit 32 is configured for supplying the grid driving signals to the grid lines 4 located in the even-number rows. The odd-number-row grid lines 4 supply the grid driving signals to the odd-number-th pixel units P of the corresponding one row of the pixel units P, and the even-number-row grid lines 4 supply the grid driving signals to the even-number-th pixel units P of the corresponding one row of the pixel units P. The one or more multiplexers 2 include a first multiplexer 21 and a second multiplexer 22. Each of the frame-starting-up-signal outputting units 201 of the first multiplexer 21 is configured for supplying the frame starting-up signal to one of the first grid driving circuits 31. Each of the frame-starting-up-signal outputting units 201 of the second multiplexer 22 is configured for supplying the frame starting-up signal to one of the second grid driving circuits 32. In a large-size display panel, one row of the pixel units P are delimited according to odd-even numbers. The odd-number-th pixel units P in one row of the pixel units P are connected to one grid line 4, and are supplied with the grid driving signals by the first grid driving circuit 31. The even-number-th pixel units P in one row of the pixel units P are connected to one grid line 4, and are supplied with the grid driving signals by the second grid driving circuit 32. In such a connection mode, separate controlling over the pixel units P of the odd-number columns and the pixel units P of the even-number columns of the display panel can be realized, and, when one row of the pixel units P of a large-size display panel or a super-high-pixel-density display panel have a high quantity, the quality of the signal transmission is ensured.

Figure 5:
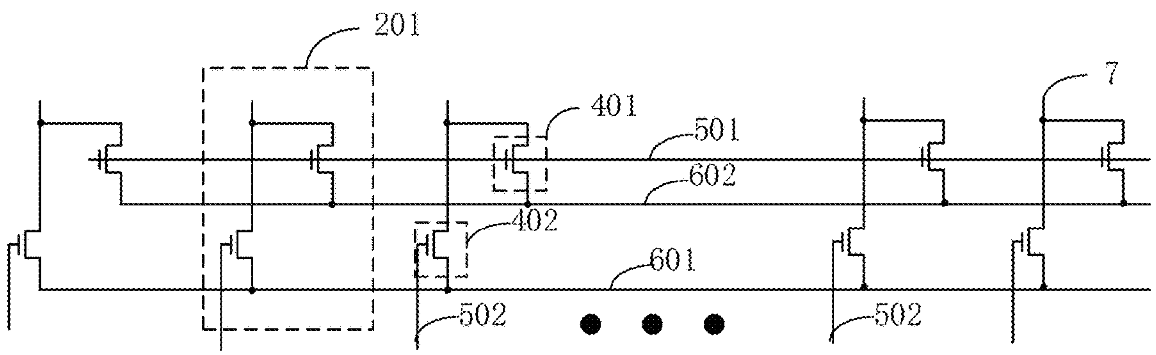
FIG. 5 is a schematic diagram of a multiplexer according to the present disclosure.

In some examples, FIG. 5 is a schematic diagram of a multiplexer according to the present disclosure. As shown in FIG. 5, each of the frame-starting-up-signal outputting units 201 in the multiplexer 2 includes signal gating transistors 401 and subregion gating transistors 402. The control electrodes of the signal gating transistors 401 in the multiplexer 2 are connected to the same first gating signal line 501, the first electrodes of the signal gating transistors 401 are connected to the same reference-voltage signal line 602, and the second electrodes of the signal gating transistors 401 are individually connected to a frame-starting-up-signal terminal STU of the grid driving circuit corresponding thereto. The control electrodes of the subregion gating transistors 402 in the multiplexer 2 are individually independently connected to second gating signal lines 502, and the first electrodes of the subregion gating transistors 402 are connected to the same driving-voltage signal line 601. The second electrodes of the subregion gating transistors 402 are individually connected to a frame-starting-up-signal terminal STU of the grid driving circuit corresponding thereto. In one multiplexer 2, the signal gating transistors 401 control the operating state under the controlling by the first gating signal lines 501, and the control electrodes of the signal gating transistors 401 are connected to the same first gating signal line 501. Correspondingly, one multiplexer 2 requires merely one first gating signal to control the turning-on and turning-off of all of the signal gating transistors 401.

In some examples, if a plurality of multiplexers 2 are provided, for the frame-starting-up-signal outputting units 201 in the multiplexers 2 that supply the frame starting-up signals to the same grid driving unit 3, the control electrodes of the subregion gating transistors 402 therein are connected to the same second gating signal line 502. The quantity of the frame-starting-up-signal outputting units 201 in the multiplexers 2 is equal to the quantity of the active areas 1 of the display panel. The grid driving units 3 in one active area 1 may have a plurality of grid driving circuits, each of the grid driving circuits corresponds to one of the frame-starting-up-signal outputting units 201 in different multiplexers 2, and the control electrodes of the subregion gating transistors 402 in the frame-starting-up-signal outputting units 201 that correspond to the same active area 1 are connected to the same second gating signal line 502. In other words, the quantity of the second gating signal lines 502 is equal to the quantity of the active areas 1 of the display panel, and is not influenced by the quantity of the multiplexers 2.

In an embodiment of the present disclosure, the multiplexers 2 are used to control the grid driving circuits within the plurality of regions, which reduces the quantity of the signals, and thus reduces the quantity of the signal lines, thereby realizing a sufficient room for the fabrication of the grid driving circuits when the display panel has a high pixel density. That will be illustrated by taking the case as an example in which the display panel is delimited into 9 regions, one row of the pixel units P are divided into odd-even numbers and the pixel driving circuit in FIG. 1 is employed. As shown in FIG. 1, the grid lines 4 of the display panel supply the grid driving signals to the control electrodes of the data writing transistors. Because one row of the pixel units P are divided into odd-even numbers, or, in other words, the pixel units P at interval are connected to one grid line 4, within one active area 1, two grid driving circuits are required to control two groups of grid lines 4, the odd-number-row grid lines 4 in the two groups of grid lines 4 control the odd-number-th pixel units P in the corresponding rows of the pixel units P, and the even-number-row grid lines 4 control the even-number-th pixel units P in the corresponding rows of the pixel units P. The pixel driving circuit further includes a second scanning signal, a third scanning signal and a light-emission controlling signal, and, therefore, three grid driving circuits are further required to supply the second scanning signal, the third scanning signal and the light-emission controlling signal. The display panel corresponds to 9 active areas 1, and, in order to control all of the pixel units P in one row of the pixel units P to operate, 5 grid driving circuits are required. Therefore, in order to control all of the grid driving circuits in the display panel to operate, 45 signals are required, and, correspondingly, at least 45 signal lines are required.

By providing the multiplexers 2, the operations of the grid driving circuits in the grid driving units 3 can be controlled by using the multiplexers 2. One active area 1 corresponds to 5 types of signals, and, therefore, it is required to provide 5 multiplexers 2, which are a first multiplexer 21, a second multiplexer 22, a resetting multiplexer 2 for correspondingly controlling the resetting transistor, an initializing multiplexer 2 for correspondingly controlling the initializing transistor and a light-emission controlling multiplexer 2 for correspondingly controlling the light-emission controlling transistor. The display panel includes 9 subregions, and each of the 5 multiplexers 2 includes 9 frame-starting-up-signal outputting units 201. In order to control all of the grid driving circuits in the display panel to operate, 9 second gating signals, 5 driving-voltage signals, 5 first gating signals and reference-voltage signals that correspond to the 9 subregions are required, wherein the reference-voltage signals include 1 high-voltage signal and 1 low-voltage signal. Merely totally 21 signals are required to realize the controlling over all of the grid driving circuits of the display panel. As compared with the case in which the multiplexers 2 are not provided, by providing the multiplexers 2, the quantity of the signals is highly reduced, and the quantity of the signal lines is also reduced, which enables the room on the display panel available for the fabrication of the circuits to be increased to a certain extent.

In an embodiment of the present disclosure, the second multiplexer 22 is taken as an example for further description. The second multiplexer 22 correspondingly controls the second grid driving circuit 32, to supply the grid driving signals to the even-number-row grid lines 4, to realize supplying the grid driving signals to the even-number-th pixel units P in one row of the pixel units P. In order to write data into the pixel driving circuit by using the data writing transistors, it is required to control the data writing transistors to be turned on. At this point, among the frame-starting-up-signal outputting units 201 of the second multiplexer 22, the control electrodes of the signal gating transistors 401 receive the low-level signal transmitted by the first gating signal line 501, and the signal gating transistors 401 are turned off, to stop sending the reference-voltage signals to the frame-starting-up-signal terminals STU of the corresponding grid driving circuits, at which point the reference-voltage signals are low-level signal. The second gating signal lines 502 send signals to the control electrodes of the subregion gating transistors 402, and the subregion gating transistors 402 are turned on, to send the driving-voltage signals to the frame-starting-up-signal terminals STU of the corresponding grid driving circuits, at which point the frame-starting-up-signal outputting units 201 start operating.

It should be noted that the driving-voltage signals in the multiplexers 2 are different. For example, the waveforms of the driving-voltage signals of the first multiplexer 21 and the second multiplexer 22 are the waveforms of the grid driving signals in FIG. 2. Correspondingly, the oscillogram of the driving-voltage signal corresponding to the resetting multiplexer 2 is the same as the oscillogram of the second scanning signal in FIG. 2. The oscillogram of the driving-voltage signal corresponding to the initializing multiplexer 2 is the same as the oscillogram of the third scanning signal in FIG. 2. The oscillogram of the driving-voltage signal corresponding to the light-emission controlling multiplexer 2 is the same as the oscillogram of the third scanning signal in FIG. 2. The reference voltages of the first multiplexer 21, the second multiplexer 22, the resetting multiplexer 2 and the initializing multiplexer 2 are equal, all of which are a low-level voltage, and can be controlled by using one reference-voltage line. Moreover, the reference voltage of the light-emission controlling multiplexer 2 is a high-level voltage, and, therefore, it is required to be separately connected to one reference-voltage line.

It is realized that, when the entire pixel driving circuit is operating, the first gating signal lines 501, according to the operation time sequence of the pixel driving circuit, control all of the signal gating transistors 401 of the corresponding multiplexer 2 to be turned on or turned off, and accordingly control the operating state of the multiplexer 2. After the first gating signal has supplied the low-level signal to the corresponding multiplexer 2 to cause the signal gating transistors 401 to be turned off, the second gating signal lines 502 select the active area 1 required to operate, the realize cyclic operation or partial operation of the active areas 1.

It should be noted that the quantity of the multiplexers 2 may be varied according to the design of the pixel driving circuit, and may be regulated according to the structural design of the display panel. The quantity of the frame-starting-up-signal outputting units 201 included by each of the multiplexers 2 may be equal to the quantity of the subregions of the display panel, and is not particularly limited further herein.

Figure 6:
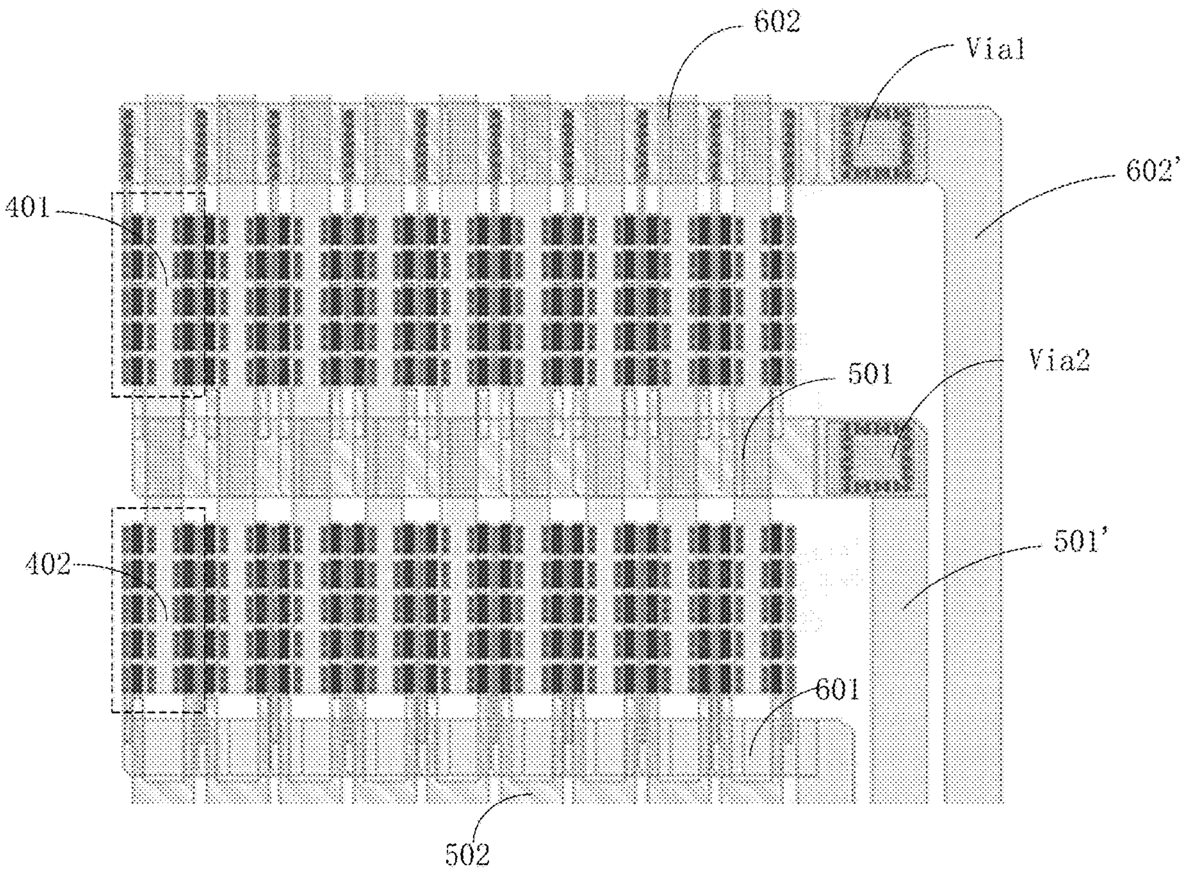
FIG. 6 is a schematic structural diagram of one of the multiplexers according to the present disclosure.
Figure 7:
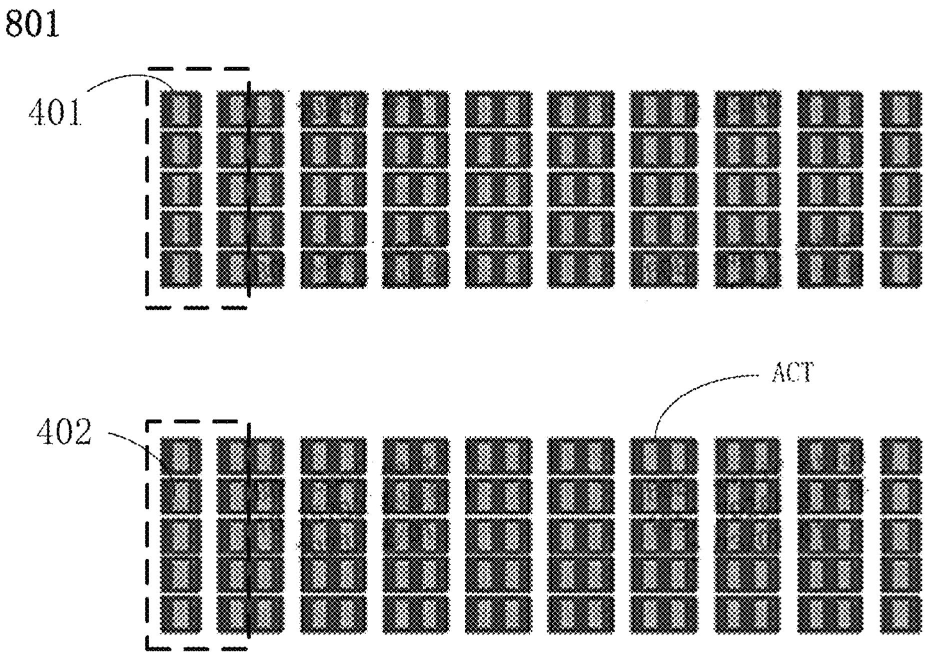
FIGS. 7-10 are schematic structural diagrams of the layers of the multiplexer according to the present disclosure.
Figure 8:
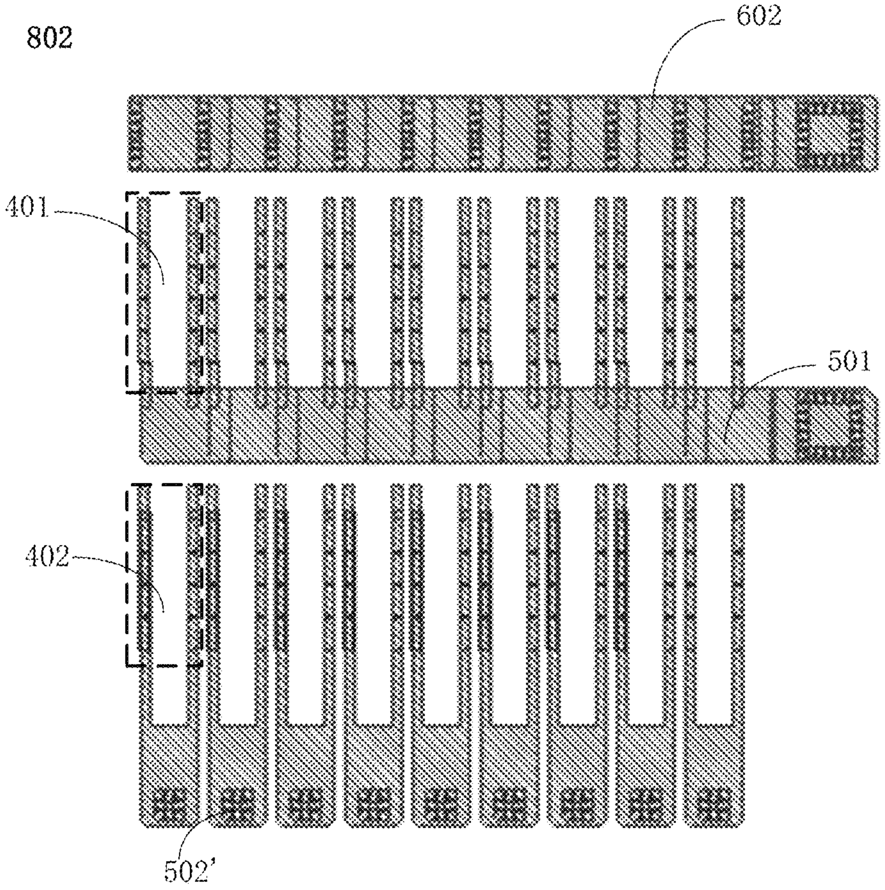
Figure 9:
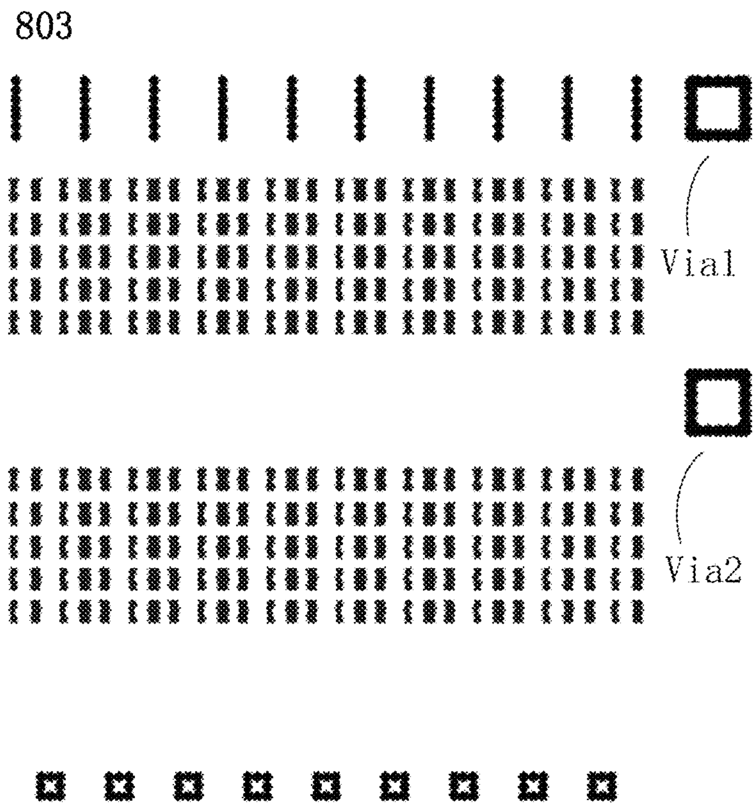
Figure 10:
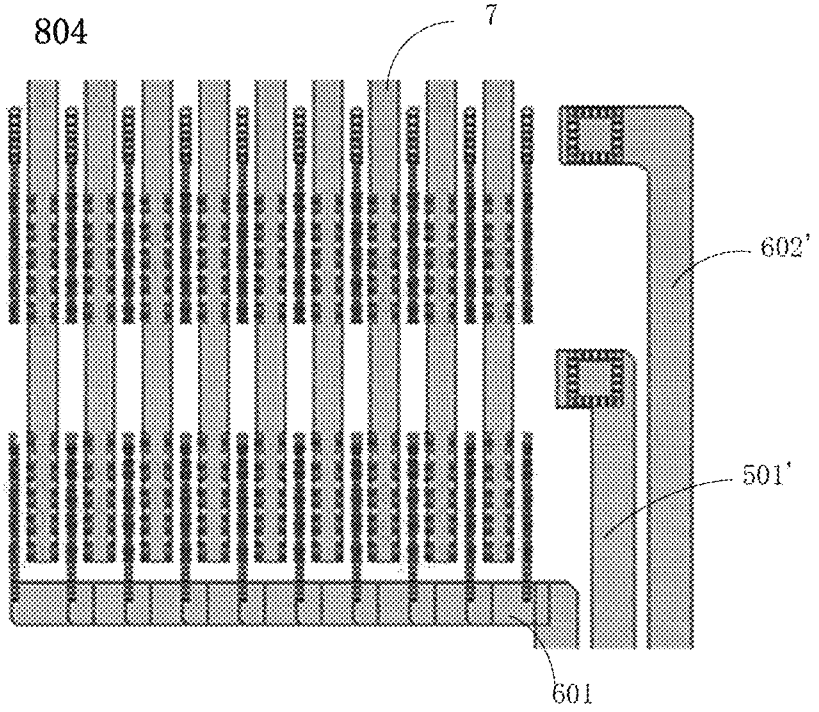

In an embodiment of the present disclosure, FIG. 6 is a schematic structural diagram of one of the multiplexers according to the present disclosure. FIG. 7 to FIG. 10 are schematic structural diagrams of the layers of the multiplexer according to the present disclosure. As shown in FIG. 6 to FIG. 10, on the basis of the above-described structures, the grid-driving-circuit array further includes a substrate, and the multiplexers 2 and the reference-voltage signal lines 602 connected thereto, the first gating signal line 501 and the driving-voltage signal line 601 are provided on the substrate. All of the reference-voltage signal line 602, the first gating signal line 501 and the driving-voltage signal line 601 extend in the row direction, and the reference-voltage signal line 602, the first gating signal line 501 and the driving-voltage signal line 601 are arranged side by side in the column direction. The subregion gating transistors 402 are located between the first gating signal line 501 and the driving-voltage signal line 601. The signal gating transistors 401 are located between the reference-voltage signal line 602 and the first gating signal line 501. The subregion gating transistors 402 and the signal gating transistors 401 in each of the frame-starting-up-signal outputting units 201 are arranged correspondingly in the column direction. The subregion gating transistors 402 in each of the frame-starting-up-signal outputting units 201 are arranged sequentially side by side in the row direction. The signal gating transistors 401 in each of the frame-starting-up-signal outputting units 201 are arranged sequentially side by side in the row direction. The above-described design mode can reduce the occupied area, facilitates the fabrication, does not require a complicated wiring mode, and does not require fabricating excessively many film-layers.

In some examples, on the basis of the above-described structures, a reference-voltage-signal switching line 602' and a first gating-signal switching line 501' are provided on the substrate. The reference-voltage-signal switching line 602' and the first gating-signal switching line 501' extend in the column direction, and the reference-voltage-signal switching line 602' and the first gating-signal switching line 501' are separated in the row direction. The reference-voltage-signal switching line 602' is electrically connected to the reference-voltage signal line 602. The first gating-signal switching line 501' is electrically connected to the first gating signal line 501. The reference-voltage-signal switching line 602' and the first gating-signal switching line 501' extend in the column direction, which facilitates the connection to the circuit board on one side of the display panel, to receive the corresponding signals.

In some examples, on the basis of the above-described structures, the substrate further includes a first conductive layer 802, an inter-layer insulating layer 803 and a second conductive layer 804 that are sequentially arranged in the direction further away from the substrate. The control electrodes of the signal gating transistors 401, the control electrodes of the subregion gating transistors 402, the reference-voltage signal line 602 and the first gating signal line 501 are located at the first conductive layer 802. The driving-voltage signal line 601, the reference-voltage-signal switching line 602' and the first gating-signal switching line 501' are located at the second conductive layer 804. The reference-voltage-signal switching line 602' is electrically connected to the reference-voltage signal line 602 by a first connecting via hole penetrating the inter-layer insulating layer 803. The first gating-signal switching line 501' is electrically connected to the first gating signal line 501 by a second connecting via hole penetrating the inter-layer insulating layer 803. The driving-voltage signal line 601 is electrically connected to the first electrode of the subregion gating transistor 402 by a third connecting via hole penetrating the inter-layer insulating layer 803. The first electrodes of the subregion gating transistors 402 are connected to the independent third connecting via holes. The reference-voltage signal line 602 and the driving-voltage signal line 601 may also be provided with reference-voltage-signal lead wires and driving-voltage-signal lead wires that extend in the column direction and are arranged in parallel in the row direction. The reference-voltage-signal lead wires correspond to the signal gating transistors 401 one to one, and the driving-voltage-signal lead wires correspond to the subregion gating transistors 402 one to one. The reference-voltage-signal lead wires and the driving-voltage-signal lead wires may be provided in the first conductive layer 802, the second conductive layer 804 or another film layer, which is not particularly limited further herein. The side of the first conductive layer 802 that is closer to the substrate further includes a first semiconductor layer 801. The first semiconductor layer 801 is used to fabricate the active layers of the subregion gating transistors 402 and the signal gating transistors 401, the arrangement modes of which are the same as the arrangement modes of the subregion gating transistors 402 and the signal gating transistors 401, and are not described repeatedly herein. A grid insulating layer is between the first semiconductor layer 801 and the first conductive layer 802.

In some examples, the first conductive layer 802 further includes second gating-signal switching terminals 502', and the second gating-signal switching terminals 502' are configured for connecting the control electrodes of the subregion gating transistors 402 to the independent second gating-signal switching terminals 502'. The second gating-signal terminals are connected to the corresponding second gating signal lines 502. The second gating signal lines 502 may be provided in the first conductive layer 802, the second conductive layer 804 or another film layer according to practical demands and product designs, which is not particularly limited further herein.

In some examples, the second conductive layer 804 further includes frame-starting-up-signal switching lines 7. The frame-starting-up-signal switching lines 7 are individually connected to a frame-starting-up-signal terminal STU of the grid driving circuit corresponding thereto. The frame-starting-up-signal switching lines 7 extend in the column direction, and the frame-starting-up-signal switching lines 7 are arranged in parallel in the row direction. The frame-starting-up-signal switching lines 7 are connected to the second electrodes of the signal gating transistors 401 by fourth connecting via holes penetrating the inter-layer insulating layer 803, and the second electrodes of the signal gating transistors 401 are electrically connected to the frame-starting-up-signal switching lines 7 by the independent fourth connecting via holes. The frame-starting-up-signal switching lines 7 are connected to the second electrodes of the subregion gating transistors 402 by fifth connecting via holes penetrating the inter-layer insulating layer 803, and the second electrodes of the subregion gating transistors 402 are electrically connected to the frame-starting-up-signal switching lines 7 by the independent fifth connecting via holes.

Figure 11:
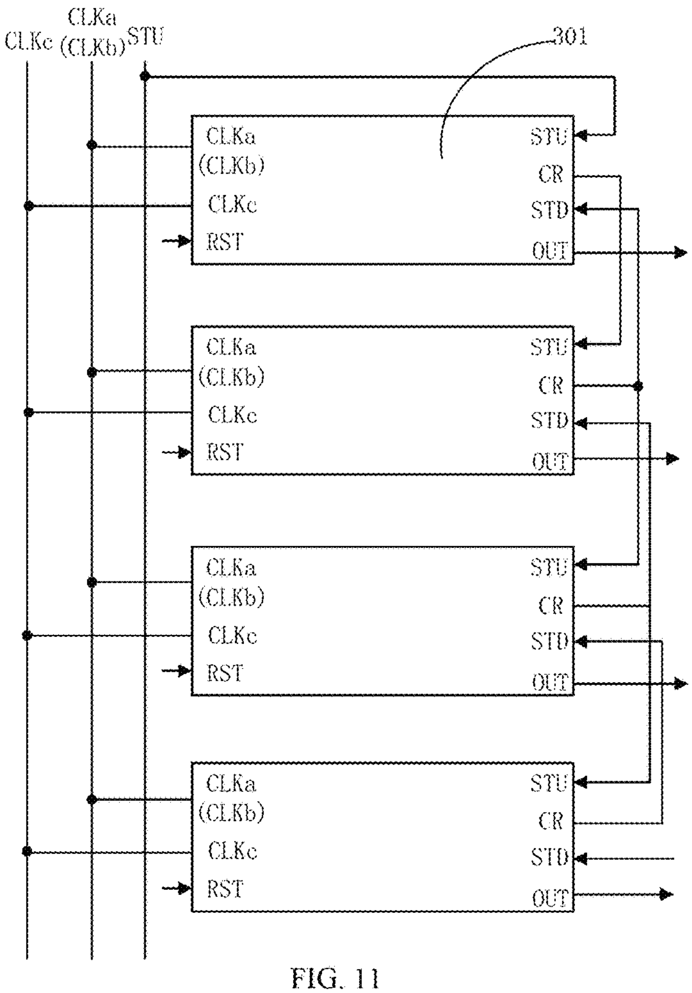
FIG. 11 is a schematic diagram of the cascading of a plurality of shift registers according to an embodiment of the present disclosure.
Figure 12:
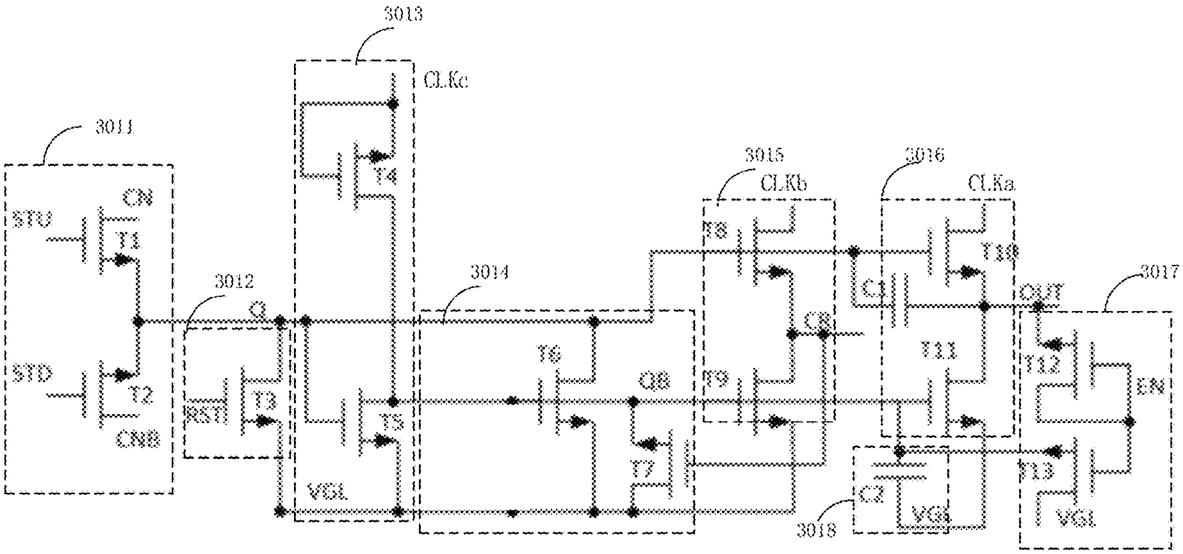
FIG. 12 is a schematic structural diagram of a shift-register circuit according to an embodiment of the present disclosure.
Figure 13:
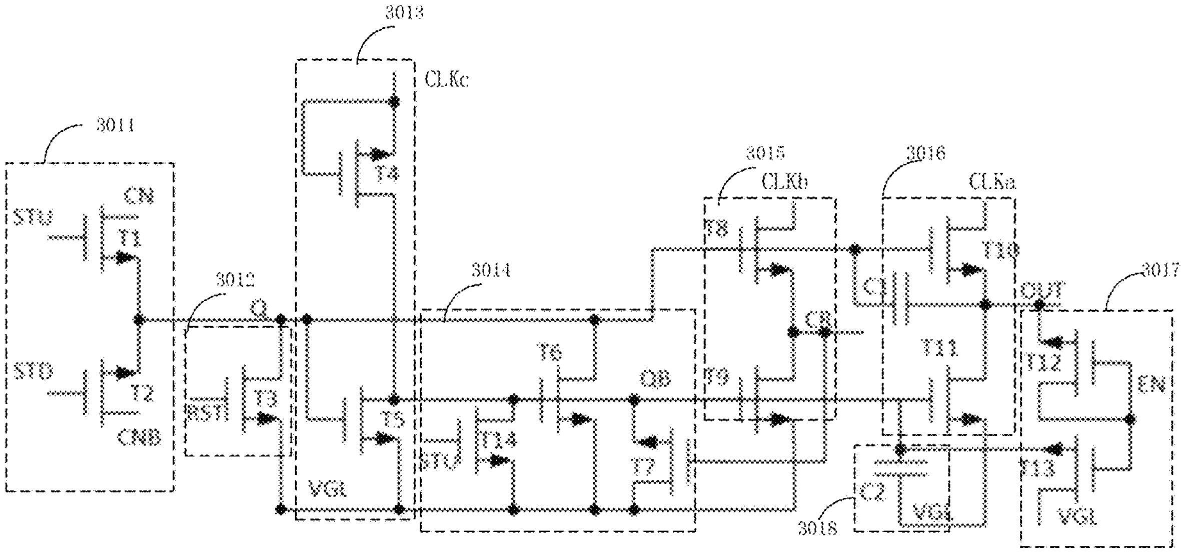
FIG. 13 is a schematic structural diagram of a shift-register circuit according to an embodiment of the present disclosure.

In an embodiment of the present disclosure, FIG. 11 is a schematic diagram of the cascading of a plurality of shift registers according to an embodiment of the present disclosure. FIG. 12 is a schematic structural diagram of a shift-register circuit according to an embodiment of the present disclosure. FIG. 13 is a schematic structural diagram of a shift-register circuit according to an embodiment of the present disclosure. As shown in FIGS. 11-13, each of the grid driving circuits includes a plurality of shift registers 301 that are cascaded, and each of the shift registers 301 includes a frame-starting-up-signal terminal STU, an initializing-signal terminal RST, a resetting-signal terminal STD, a cascading-signal terminal CR and a grid-driving-signal terminal OUT. The cascading-signal terminal CR of the shift register 301 of the present stage is connected to the resetting-signal terminal STD of the shift register 301 of a preceding stage and a frame-starting-up-signal terminal STU of the shift register 301 of a subsequent stage. The frame starting-up signals outputted by the frame-starting-up-signal outputting units 201 usually supply the frame starting-up signals to the shift register 301 of the first stage among the plurality of cascaded shift registers 301.

In some examples, as shown in FIG. 12, each of the shift registers 301 includes an initializing unit 3012, a controlling unit 3011, a feedback unit 3013, a cascading unit 3015, an outputting unit 3016, a feedback unit 3013 and a voltage regulating unit 3014. The initializing unit 3012 is configured for receiving an initializing signal, and initializing the voltage of a first node Q. The controlling unit 3011 is configured for, under the controlling by the frame starting-up signals and a first level signal CN, starting-up the shift register 301, and charging the first node Q; and under the controlling by a resetting signal and a second level signal CNB, resetting the shift register 301. The outputting unit 3016 is configured for, under the controlling by the voltage of the first node Q and a first clock signal, outputting the grid driving signals. The cascading unit 3015 is configured for, under the controlling by the voltage of the first node Q and a second clock signal CLKb, outputting a cascading signal. The feedback unit 3013 is configured for, when the shift register 301 is outputting, under the controlling by the voltage of the first node Q, discharging a second node QB; and after the outputting of the shift register 301 is completed, under the controlling by a third clock signal CLKc, charging the second node QB. The voltage regulating unit 3014 is configured for regulating the voltage of the first node Q and the voltage of the second node QB.

In an embodiment of the present disclosure, the first node Q is the connection point of the second electrodes of the first transistor T1 and the second transistor T2, the first electrode of the third transistor T3, the control electrode of the fifth transistor T5, the first electrode of the sixth transistor, and the control electrodes of the eighth transistor and the tenth transistor. The second node QB is the connection point of the first electrode of the fifth transistor T5, the first electrode of the seventh transistor T7, the control electrodes of the ninth transistor and the eleventh transistor T11, and the first electrode of a second storing unit 3018. Therefore, the voltage of the first node Q controls the switching of the eighth transistor and the tenth transistor, and the voltage of the second node QB controls the switching of the ninth transistor and the eleventh transistor T11. Therefore, in order to cause the cascading unit 3015 to output the cascading signal and cause the outputting unit 3016 to output the grid driving signal, it is required to cause the first node Q to be at a high electric potential, and cause the second node QB to be at a low electric potential.

In some examples, the controlling unit 3011 includes a first transistor T1 and a second transistor T2. The control electrode of the first transistor T1 is connected to the frame-starting-up-signal terminal STU, the first electrode is connected to a first level-signal terminal CN, and the second electrode is connected to the second electrode of the second transistor T2 and the first node Q. The control electrode of the second transistor T2 is connected to the resetting-signal terminal STD, and the first electrode is connected to a second level-signal terminal CNB. The control electrode of the first transistor T1 is connected to the frame-starting-up-signal terminal STU, and the frame-starting-up-signal terminal STU is connected to the cascading-signal terminal CR of the shift register 301 of the preceding stage. The control electrode of the second transistor T2 is connected to the resetting-signal terminal STD, and the resetting-signal terminal STD is connected to the cascading-signal terminal CR of the shift register 301 of the subsequent stage. If the displaying mode of the display panel is forward scan, the electric properties of the first level-signal terminal CN and the second level-signal terminal CNB are opposite, the first level signal CN is a high-level signal, and the second level signal CNB is a low-level signal. If the displaying mode of the display panel is reverse scan, the first level signal CN is a low-level signal, and the second level signal CNB is a high-level signal. All of the embodiments of the present disclosure illustrate by taking the case as an example in which the displaying mode of the display panel is forward scan. After the first transistor T1 has received the frame starting-up signal, the first transistor T1 is switched on, and the high-level first level signal CN charges the first node Q. After the second transistor T2 has received the resetting signal, the second transistor T2 is switched on, the low-level second level signal CNB discharges the first node Q.

In some examples, the initializing unit 3012 includes a third transistor T3, the control electrode of the third transistor T3 is connected to an initializing-signal terminal RST, the first electrode is connected to the first node Q, and the second electrode is connected to a common-voltage terminal VGL. The third transistor T3 is turned on merely before the display panel displays, and initializes the voltage of the first node Q.

In some examples, the feedback unit 3013 includes a fourth transistor T4 and a fifth transistor T5, the first electrode and the control electrode of the fourth transistor T4 are connected to a second clock-signal terminal CLKb, and the second electrode is connected to the second node QB and the first electrode of the fifth transistor T5. The control electrode of the fifth transistor T5 is connected to the first node Q, and the second electrode is connected to the common-voltage terminal VGL. When the shift register 301 is outputting, the first node Q is at a high electric potential, the fifth transistor T5 is turned on under the controlling by the first node Q, the first electrode of the fifth transistor T5 is connected to the second node QB, and the fifth transistor T5, after being turned on, discharges the second node QB. After the outputting of the shift register 301 is completed, the shift register 301 charges the second node QB under the controlling by the third clock signal CLKc, and the voltage signal supplied by the third clock signal CLKc is stored in a second storage capacitor C2.

In some examples, the voltage regulating unit 3014 includes a first-node-Q discharging unit and a second-node-QB discharging unit. The first-node-Q discharging unit, after the outputting of the shift register 301 is completed, under the controlling by the voltage of the second node QB, discharges the first node Q. The second-node-QB discharging unit, when the shift register 301 is outputting, discharges the second node QB.

Particularly, the first-node-Q discharging unit includes a sixth transistor, the control electrode of the sixth transistor is connected to the second node QB, the second electrode of the fourth transistor T4 and the first electrode of the fifth transistor T5, the first electrode is connected to the first node Q, and the second electrode is connected to the common-voltage terminal VGL. After the outputting of the shift register 301 is completed, the feedback unit 3013 charges the second node QB, at which point the second node QB is at a high electric potential, and the sixth transistor is turned on, to discharge to the first node Q. The second-node-QB discharging unit includes a seventh transistor T7, the control electrode of the seventh transistor T7 is connected to a cascading-signal terminal CR, the first electrode is connected to the common-voltage terminal VGL, and the second electrode is connected to the second node QB. The grid driving signal and the cascading signal of the shift register 301 are outputted simultaneously. The control electrode of the seventh transistor T7 is connected to a cascading-signal terminal CR. In outputting, the seventh transistor T7 is turned on, to discharge to the second node QB, to ensure that the second node QB, when outputting, is at a low-level. The ninth transistor and the eleventh transistor T11 are not turned on to influence the outputting of the cascading signal and the grid driving signal.

In some examples, the cascading unit 3015 includes an eighth transistor and a ninth transistor. The control electrode of the eighth transistor is connected to the first node Q, the first electrode is connected to the second clock-signal terminal CLKb, and the second electrode is connected to the first electrode of the ninth transistor. The control electrode of the ninth transistor is connected to the second node QB, and the second electrode is connected to the common-voltage terminal VGL. The connection point of the second electrode of the eighth transistor and the first electrode of the ninth transistor is used as a cascading-signal terminal CR of the shift register 301. The ninth transistor, after the outputting of the cascading signal is completed, is turned on under the controlling by the voltage of the second node QB, to pull down the electric potential of the cascading-signal terminal CR.

In some examples, the outputting unit 3016 includes a tenth transistor, an eleventh transistor T11 and a first storage capacitor C1. The control electrode of the tenth transistor is connected to the first node Q and the first electrode of the first storage capacitor C1, the first electrode is connected to a first clock-signal terminal CLKa, and the second electrode is connected to the first electrode of the eleventh transistor T11 and the second electrode of the first storage capacitor C1. The control electrode of the eleventh transistor T11 is connected to the second node QB, and the second electrode is connected to the common-voltage terminal VGL. The connection point of the second electrode of the tenth transistor, the first electrode of the eleventh transistor T11 and the second electrode of the first storage capacitor C1 is used as a grid-driving-signal terminal OUT of the shift register 301. The eleventh transistor T11, after the outputting of the grid driving signal is completed, is turned on under the controlling by the voltage of the second node QB, to pull down the electric potential of the grid-driving-signal terminal OUT.

In some examples, the time domains and the amplitudes of the first clock signal and the second clock signal CLKb are totally the same, and, therefore, they may be connected to the same clock-signal line, to reduce the quantity of the signal lines, which facilitates the fabrication of a narrow border frame. The first clock-signal terminal CLKa and the second clock-signal terminal CLKb may also be separate, to be connected to different clock-signal lines, to prevent that, when a plurality of shift registers 301 are cascaded, the clock signal received by the shift register 301 of the final stage has loss. When the displaying device is a large-size display panel, each of the subregions has a high row quantity of the pixels, the clock signal might have loss in transmission, and the first clock-signal terminal CLKa and the second clock-signal terminal CLKb may be separate as two clock-signal lines to be controlled separately. When it is required to realize a narrow border frame, the first clock-signal terminal CLKa and the second clock-signal terminal CLKb may be connected to the same clock-signal line, to reduce the occupied area of the border frame.

In some examples, on the basis of the above-described structures, the shift register 301 further includes a correcting unit 3017. The correcting unit 3017 is configured for, under the controlling by an enabling-signal terminal EN, enabling the shift register 301 to output a correction controlling signal. The correcting unit 3017 includes a twelfth transistor T12 and a thirteenth transistor T13. The control electrode and the first electrode of the twelfth transistor T12 and the enabling-signal terminal EN are connected to the control electrode of the thirteenth transistor T13, and the second electrode is connected to the grid-driving-signal terminal OUT. The first electrode of the thirteenth transistor T13 is electrically connected to the common-voltage terminal VGL, and the second electrode is electrically connected to the second node QB. In normal displaying, the enabling signal maintains at a low electric potential, and the twelfth transistor T12 and the thirteenth transistor T13 are in the off-state. When abnormality in displaying happens, the enabling signal changes into a high electric potential, and the twelfth transistor T12 and the thirteenth transistor T13 are in the on-state. The enabling signal is directly used as the grid driving signal to be sent to the pixel driving circuit, to correct the abnormality in displaying. The particular type of the enabling signal and the particular correcting method for the pixel driving circuit are not particularly limited further herein.

In some examples, the shift register 301 further includes a storing unit 3018. The storing unit 3018 is configured for storing the voltage of the second node QB. The storing unit 3018 includes a second storage capacitor C2, the first electrode of the second storage capacitor C2 is connected to the second node QB, and the second electrode is connected to the common-voltage terminal VGL.

In some examples, as shown in FIG. 13, the voltage regulating unit 3014 further includes an auxiliary second-node-QB discharging unit. The auxiliary second-node-QB discharging unit is configured for, under the controlling by the frame-starting-up-signal terminal STU, discharging the second node QB. The auxiliary second-node-QB discharging unit includes a fourteenth transistor T14, the control electrode of the fourteenth transistor T14 is connected to the frame-starting-up-signal terminal STU, the first electrode is connected to the second node QB, and the second electrode is connected to the common-voltage terminal VGL. The control electrode of the fourteenth transistor T14 and the control electrode of the first transistor T1 simultaneously receive the frame starting-up signals, and the fourteenth transistor T14 is turned on, to further discharge to the second node QB. Because the second storage capacitor C2 stores the voltage of the second node QB, the fourteenth transistor T14 is provided, to prevent that the voltage of the second node QB is not completely pulled down, which affects the outputting of the cascading signal by the cascading unit 3015 and the outputting of the outputting unit 3016 by the grid driving signal. If the room on the display panel available for the fabrication of the circuits is limited, or there is a requirement on the width of the border frame, the fourteenth transistor T14 may be omitted.

In order to describe the structure of the shift register 301 according to the present disclosure better, it will be illustrated below with reference to particular examples. Referring continuously to FIG. 13, the shift register 301 includes the first transistor T1, the second transistor T2, the third transistor T3, the fourth transistor T4, the fifth transistor T5, the sixth transistor, the seventh transistor T7, the eighth transistor, the ninth transistor, the tenth transistor, the eleventh transistor T11, the twelfth transistor T12, the thirteenth transistor T13, the fourteenth transistor T14, the first storage capacitor C1 and the second storage capacitor C2. The control electrode of the first transistor T1 is connected to the frame-starting-up-signal terminal STU (the cascading-signal terminal CR of the shift register 301 of the preceding stage), the first electrode is connected to the first level-signal terminal CN, and the second electrode is connected to the second electrode of the second transistor T2 and the first node Q. The control electrode of the second transistor T2 is connected to the resetting-signal terminal STD (the cascading-signal terminal CR of the shift register 301 of the subsequent stage), and the first electrode is connected to the second level-signal terminal CNB. The control electrode of the third transistor T3 is connected to an initializing-signal terminal RST, the first electrode is connected to the first node Q, and the second electrode is connected to the common-voltage terminal VGL. The first electrode and the control electrode of the fourth transistor T4 are connected to a second clock-signal terminal CLKb, and the second electrode is connected to the second node QB and the first electrode of the fifth transistor T5. The control electrode of the fifth transistor T5 is connected to the first node Q, and the second electrode is connected to the common-voltage terminal VGL. The control electrode of the sixth transistor is connected to the second node QB, the second electrode of the fourth transistor T4 and the first electrode of the fifth transistor T5, the first electrode is connected to the first node Q, and the second electrode is connected to the common-voltage terminal VGL. The first electrode of the second storage capacitor C2 is connected to the second node QB, and the second electrode is connected to the common-voltage terminal VGL. The control electrode of the seventh transistor T7 is connected to a cascading-signal terminal CR, the first electrode is connected to the common-voltage terminal VGL, and the second electrode is connected to the second node QB. The control electrode of the eighth transistor is connected to the first node Q, the first electrode is connected to the second clock-signal terminal CLKb, and the second electrode is connected to the first electrode of the ninth transistor. The control electrode of the ninth transistor is connected to the second node QB, and the second electrode is connected to the common-voltage terminal VGL. The connection point of the second electrode of the eighth transistor and the first electrode of the ninth transistor is used as a cascading-signal terminal CR of the shift register 301. The control electrode of the tenth transistor is connected to the first node Q and the first electrode of the first storage capacitor C1, the first electrode is connected to the first clock-signal terminal CLKa, and the second electrode is connected to the first electrode of the eleventh transistor T11 and the second electrode of the first storage capacitor C1. The control electrode of the eleventh transistor T11 is connected to the second node QB, and the second electrode is connected to the common-voltage terminal VGL. The connection point of the second electrode of the tenth transistor, the first electrode of the eleventh transistor T11 and the second electrode of the first storage capacitor C1 is used as a grid-driving-signal terminal OUT of the shift register 301. The control electrode and the first electrode of the twelfth transistor T12 and the enabling-signal terminal EN are connected to the control electrode of the thirteenth transistor T13, and the second electrode is connected to the grid-driving-signal terminal OUT. The first electrode of the thirteenth transistor T13 is electrically connected to the common-voltage terminal VGL, and the second electrode is electrically connected to the second node QB. The control electrode of the fourteenth transistor T14 is connected to the frame-starting-up-signal terminal STU, the first electrode is connected to the second node QB, and the second electrode is connected to the common-voltage terminal VGL. The common-voltage terminal VGL is usually a low-level signal or is reference ground.

In order to describe the working process of the grid driving circuit according to the embodiments of the present disclosure better, it will be illustrated below with reference to the particular embodiments. Referring continuously to FIG. 13, the plurality of shift registers 301 in the grid driving circuit are cascaded, the cascading unit 3015 of the shift register 301 of the present stage is connected to the resetting-signal terminal STD of the preceding stage and the frame-starting-up-signal terminal STU of the subsequent stage, the frame-starting-up-signal terminal STU of the shift register 301 of the first stage is connected to one of the frame-starting-up-signal outputting units 201 of the corresponding multiplexer 2. Before the grid driving circuit operates, the control electrodes of the third transistors T3 of all of the cascaded shift registers 301 receive the initializing signals sent by the initializing-signal terminals RST, and are switched on under the controlling by the initializing signals, to initialize the voltage of the first node Q, to cause the first node Q to be at a low electric potential. After the shift registers 301 of the grid driving circuit have completed the initialization of the first nodes Q, the frame-starting-up-signal terminal STU receives the cascading signal of the shift register 301 of the preceding stage (the frame-starting-up-signal terminal STU of the shift register 301 of the first stage is connected to one of the frame-starting-up-signal outputting units 201 of one multiplexer 2), the control electrode of the first transistor T1 is switched on under the controlling by the high-level signal received by the frame-starting-up-signal terminal STU, and the first electrode receives the first level signal CN and charges the first node Q. The first node Q, under the controlling by the first level signal CN, is at a high electric potential, and the fifth transistor T5, the eighth transistor and the tenth transistor are turned on and switched on. Because, before the first transistor T1 is switched on, the fourth transistor T4, by the effect of a third level signal, continuously charges the second node QB and stores the voltage of the second node QB into the second storing unit 3018, so as to ensure that the ninth transistor and the eleventh transistor T11 maintain the on-state and stop the outputting of the cascading-signal terminal CR and the grid-driving-signal terminal OUT, it is required to discharge to the second node QB. The fifth transistor T5, after being switched on, discharges the second node QB, to pull down the second node QB to a low electric potential, and the ninth transistor and the tenth transistor are turned off. The voltage of the second node QB is stored in the second storage capacitor C2, and, therefore, in order for better denoising, the control electrode of the fourteenth transistor T14 and the control electrode of the first transistor T1 simultaneously receive the frame starting-up signals and are turned on, and the first electrode of the fourteenth transistor T14 is connected to the second node QB, to further discharge to the second node QB. The eighth transistor and the tenth transistor are turned on, the ninth transistor and the eleventh transistor T11 are turned off, the first electrode of the eighth transistor receives the second clock signal CLKb, the first electrode of the tenth transistor receives the first clock signal, wherein the first clock signal and the second clock signal CLKb may be supplied by one clock-signal line, after the eighth transistor has received the second clock signal CLKb the cascading-signal terminal CR outputs the cascading signal, and after the tenth transistor has received the first clock signal the grid-driving-signal terminal OUT outputs the grid driving signal. The control electrode of the seventh transistor T7 is connected to a cascading-signal terminal CR, and, therefore, when the cascading signal is being outputted, the seventh transistor T7 is turned on, to further discharge to the second node QB. After the outputting of the cascading-signal terminal CR and the grid-driving-signal terminal OUT have been completed, the third level signal controls the fourth transistor T4 to be turned on and charge the second node QB, and the sixth transistor, under the controlling by the voltage of the second node QB, is turned on and discharges the first node Q. After the shift register 301 of the subsequent stage has completed the above-described operations, the resetting-signal terminal STD of the shift register 301 of the present stage receives the cascading signal of the shift register 301 of the subsequent stage, the second transistor T2 is turned on under the controlling by the high-level signal of the resetting-signal terminal STD, and the first electrode of the second transistor T2 receives a low level to reset the first node Q, to wait for the operation of the next time. The first level signal CN and the second level signal CNB are the same. The third level signal has the same period as those of the first level signal CN and the second level signal CNB, but the time domains are different, wherein the rising edge of the third level signal is different from the rising edges of the first level signal CN and the second level signal CNB by a half of period.

Figure 14:
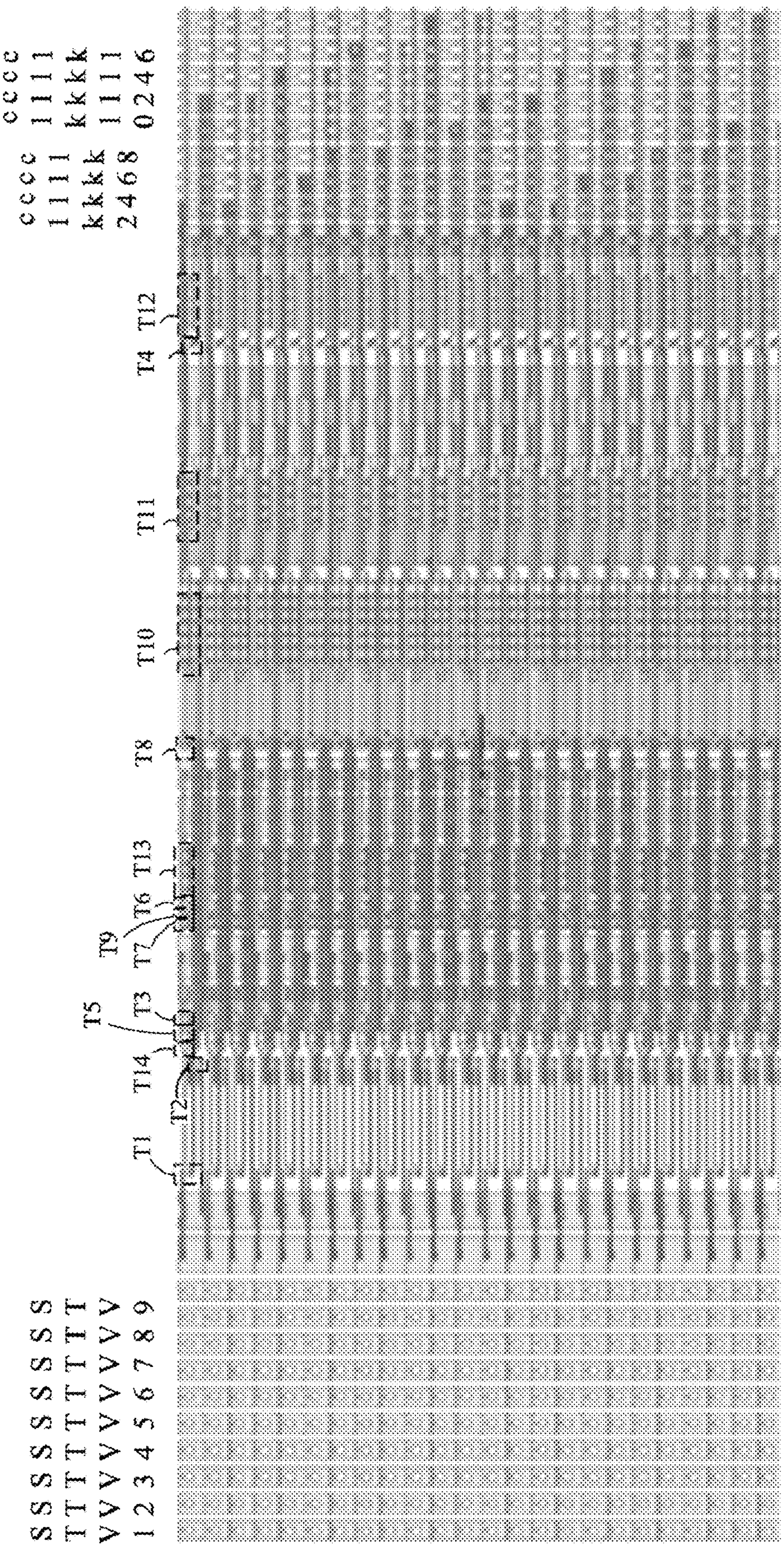
FIG. 14 is a partially schematic structural diagram of a grid driving circuit according to the present disclosure.
Figure 15:
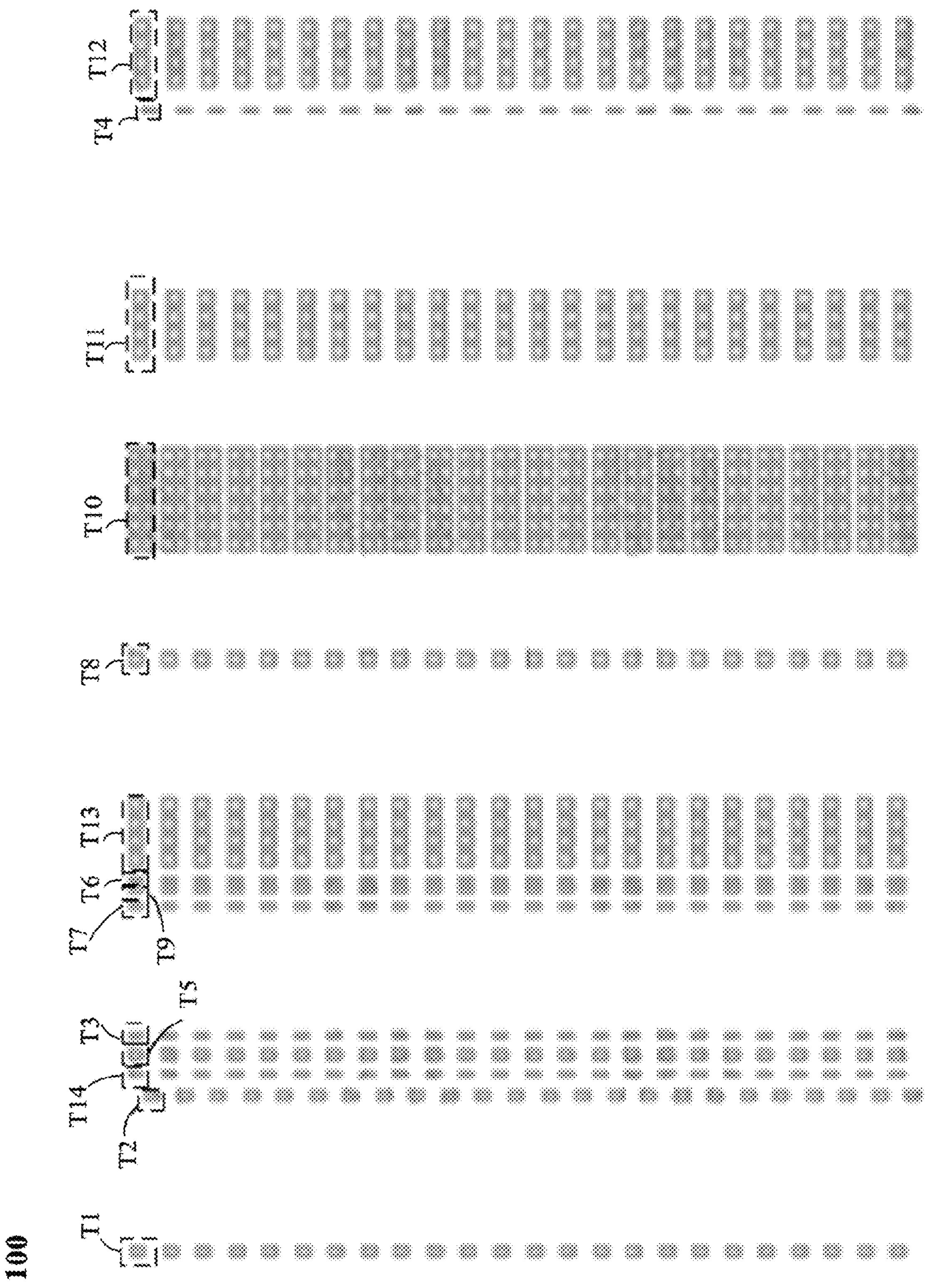
FIG. 15 is a schematic diagram of the active layer in FIG. 14.
Figure 16:
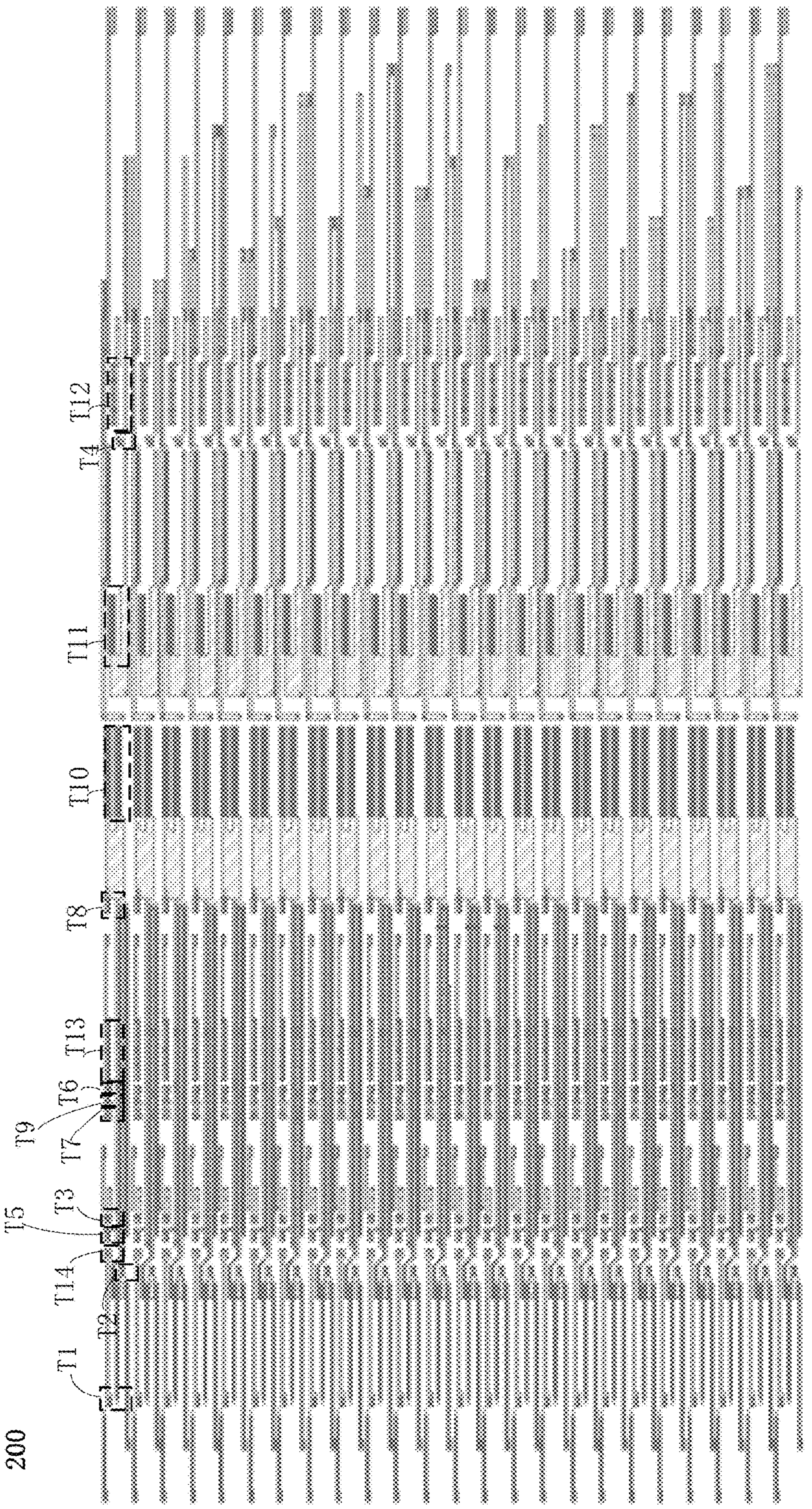
FIGS. 16 and 17 are schematic diagrams of the conductive layer in FIG. 14.
Figure 17:
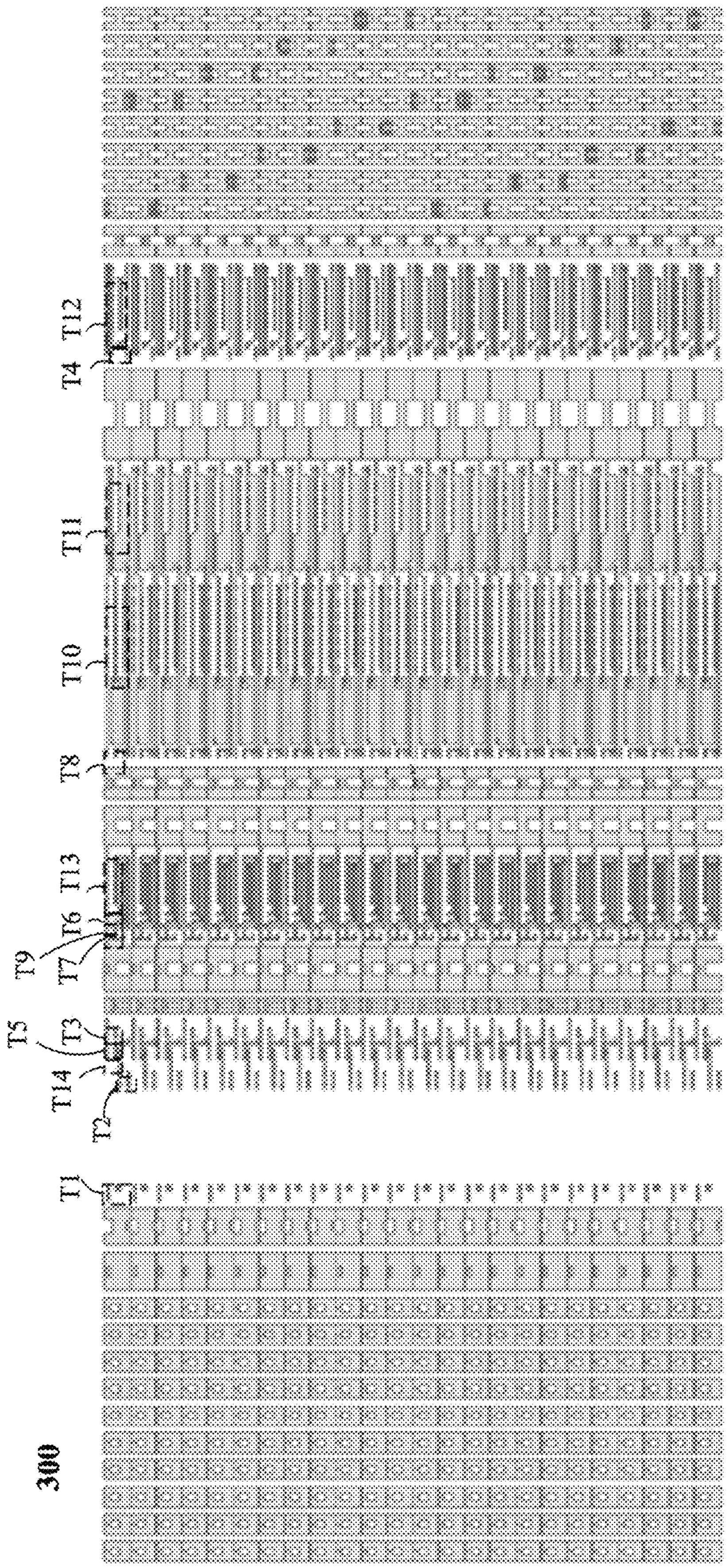

In an embodiment of the present disclosure, FIG. 14 is a partially schematic structural diagram of a grid driving circuit according to the present disclosure. FIG. 15 is a schematic diagram of the active layer in FIG. 14. FIGS. 16 and 17 are schematic diagrams of the conductive layer in FIG. 14. The grid driving units 3 may be provided on any side of the grid lines 4. The case is taken as an example for the description in which each of the grid driving units 3 includes the first grid driving circuit 31 and the second grid driving circuit 32 and the display panel includes 9 active areas 1. Each of the grid driving circuits includes a second semiconductor layer 100, a third conductive layer 200 and a fourth conductive layer 300 that are sequentially arranged in the direction further away from the substrate, and the active layers of the transistors of the shift registers 301 are provided in the second semiconductor layer 100. As shown in FIGS. 14 and 15, the second grid driving circuit 32 includes frame-starting-up-signal switching lines 7 (STV1-STV9) used to transmit the frame starting-up signals from the frame-starting-up-signal outputting units 201 of the multiplexers 2 to the corresponding frame-starting-up-signal terminals STU, and a plurality of clock-signal lines. Because each of the grid driving units 3 includes two grid driving circuits, and the display panel is delimited into 9 active areas 1, at least 18 clock-signal lines are required. The clock-signal lines CLK2, CLK4, CLK6, CLK8, CLK10, CLK12, CLK14, CLK16 are fabricated together, to supply the clock signals to the second grid driving circuit 32, and the clock-signal lines CLK1, CLK3, CLK5, CLK7, CLK9, CLK11, CLK13, CLK15 are fabricated together (not shown in the figure), to supply the clock signals to the first grid driving circuit 31. The shift register 301 is fabricated between the frame-starting-up-signal lines and the clock-signal lines, and the shift register 301 is connected to two clock-signal lines, wherein the positions of the transistors are shown in FIGS. 14-17, in the figures merely the arrangement of the transistors of one shift register 301 is marked, and the arrangement modes of the transistors of the shift registers 301 are the same. As shown in FIGS. 14-17, in the direction from the frame-starting-up-signal switching lines 7 pointing to the clock-signal lines, sequentially fabricated are the first transistor T1, the second transistor T2, the fourteenth transistor T14, the fifth transistor T5, the third transistor T3, the seventh transistor T7, the ninth transistor T9, the sixth transistor T6, the thirteenth transistor T13, the eighth transistor T8, the tenth transistor T10, the eleventh transistor T11, the fourth transistor T4 and the twelfth transistor T12. The first transistors T1 are fabricated on the side that is closer to the frame-starting-up-signal switching lines 7 (STV1-STV9). Because the control electrodes of the first transistors T1 are required to be connected to the frame-starting-up-signal switching lines 7, the first transistors T1, in the fabrication, are close to the frame-starting-up-signal switching lines 7, so as to facilitate the inter-line connecting. The first transistor T1 and the second transistor T2 are fabricated adjacently, to form a controlling unit. Because the first electrode of the eighth transistor T8 and the first electrode of the tenth transistor T10 may be connected to the same clock-signal line, they are fabricated adjacently, to cause the equal overlining lengths, to prevent transmission errors caused by different overlines. The fourth transistor T4 is also required to be connected to a clock-signal line, so it is adjacent to the clock-signal line, to reduce the overlining distance. The transistors of one shift register 301, in the fabrication, are located substantially in the same row, which reduces the room occupied in the column direction. The shift registers 301 according to the embodiments of the present disclosure occupy a small room in the longitudinal direction. Furthermore, by using such a structural design, when the shift registers 301 are connected to the clock-signal lines, the overlining capacitances are substantially equal. That ensures that the RC loads of the clock-signal lines maintain equal, which can prevent that, because the clock signals transmitted by the clock-signal lines are different, the outputs of the grid driving circuits are different, which finally causes voltage mis-charging.

It should be noted that the second semiconductor layer of the grid driving circuit may be in the same plane as that of the first semiconductor layer of the multiplexer, the third conductive layer of the grid driving circuit may be in the same plane as that of the first conductive layer of the multiplexer, and the fourth conductive layer of the grid driving circuit may be in the same plane as that of the second conductive layer of the multiplexer.

The grid-driving-circuit array according to the embodiments of the present disclosure may also be used in the technique of 3D displaying, so as to, by providing the subregions of the display panel, realize different clarities of different subregions. According to the demands on the refresh frequency in displaying, for different regions, the pixel units P are combined for the displaying, to reduce the resolutions of the subregions. In the existing IC, the signal refresh time should not be less than 1.45 μs. For ultrahigh-resolution displaying, for example, a resolution of 3840×2160, one pixel group has 11 pixel units P in the horizontal direction and three rows of RGB pixels in the vertical direction, i.e., 3840×11 columns of pixels in the horizontal direction and 2160×3 rows of pixels the vertical direction. When the refresh frequency is 30 Hz, it can be realized that 6 regions are of a high definition and 3 regions are of a medium definition, or that 7 regions are of a high definition and 2 regions are of a low definition. Therefore, by using the multiplexers 2 to control the grid driving units 3 of the active areas 1, subregions displaying can be realized in which different regions have different clarities, to be used in high-PPI 3D displaying techniques.

An embodiment of the present disclosure further provides a display panel, wherein the display panel includes the grid-driving-circuit array according to any one of the above embodiments. The display panel is delimited into a pixel region and a non-pixel region. The grid driving units and the multiplexers of the grid-driving-circuit array are located within the non-pixel region. The non-pixel region includes a fanning-out trace region located on one side of the pixel region, and the multiplexers are located within the fanning-out trace region, and the grid-driving-circuit array is located on the lateral side of the display panel.

It should be understood that the above-described structure is merely an example, and may be adjusted according to practical demands of products, which is not particularly limited further herein.

It can be understood that the above embodiments are merely exemplary embodiments intended to describe the principle of the present disclosure, but the present disclosure is not limited thereto. A person skilled in the art may make various variations and improvements without departing from the spirit and the essence of the present disclosure, and those variations and improvements are also considered as falling within the protection scope of the present disclosure.

The invention claimed is:

1. A grid-driving-circuit array, wherein the grid-driving-circuit array is applied to a display panel, the display panel is delimited into a plurality of active areas, and each of the active areas comprises multiple rows of pixel units and multiple rows of grid lines; and the grid-driving-circuit array comprises:

multiple groups of grid driving units, wherein the multiple groups of grid driving units supply grid driving signals to the plurality of active areas, and each of the groups of grid driving units comprises one or more grid driving circuits; and the one or more grid driving circuits are configured for supplying the grid driving signals to the grid lines within the active area corresponding to the one or more grid driving circuits; and one or more multiplexers, wherein each of the multiplexers comprises a plurality of frame-starting-up-signal outputting units, each of the frame-starting-up-signal outputting units of the multiplexer is configured for supplying a frame starting-up signal to one of the grid driving circuits, and the frame starting-up signals of different grid driving circuits in each of the groups of the grid driving units are supplied by the frame-starting-up-signal outputting units in different multiplexers, wherein each of the frame-starting-up-signal outputting units in the multiplexer comprises signal gating transistors and subregion gating transistors;

control electrodes of the signal gating transistors in the multiplexer are connected to a same first gating signal line, first electrodes of the signal gating transistors are connected to a same reference-voltage signal line, and second electrodes of the signal gating transistors are individually connected to a frame-starting-up-signal terminal of the grid driving circuit corresponding thereto;

control electrodes of the subregion gating transistors in the multiplexer are individually independently connected to second gating signal lines, and first electrodes of the subregion gating transistors are connected to a same driving-voltage signal line; and second electrodes of the subregion gating transistors are individually connected to a frame-starting-up-signal terminal of the grid driving circuit corresponding thereto.

2. The grid-driving-circuit array according to claim 1, wherein each of the groups of grid driving units comprises two grid driving circuits, and the two grid driving circuits refers to a first grid driving circuit and a second grid driving circuit, respectively;

for one of the grid driving units and the grid lines within the active area corresponding to the one of the grid driving units, the first grid driving circuit is configured for supplying the grid driving signals to the grid lines located in odd-number rows, and the second grid driving circuit is configured for supplying the grid driving signals to the grid lines located in even-number rows;

the one or more multiplexers include a first multiplexer and a second multiplexer;

each of the frame-starting-up-signal outputting units of the first multiplexer is configured for supplying the frame starting-up signal to one of the first grid driving circuits; and each of the frame-starting-up-signal outputting units of the second multiplexer is configured for supplying the frame starting-up signal to one of the second grid driving circuits.

3. The grid-driving-circuit array according to claim 1, wherein if a plurality of multiplexers are provided, for the frame-starting-up-signal outputting units in each multiplexer that supply the frame starting-up signals to the same grid driving unit, control electrodes of the subregion gating transistors therein are connected to a same second gating signal line.

4. The grid-driving-circuit array according to claim 1, wherein the grid-driving-circuit array further comprises a substrate, and the multiplexers and the reference-voltage signal lines, the first gating signal lines and the driving-voltage signal lines which are connected to the multiplexers are provided on the substrate;

all of the reference-voltage signal line, the first gating signal line and the driving-voltage signal line extend in a row direction, and the reference-voltage signal line, the first gating signal line and the driving-voltage signal line are arranged side by side in a column direction;

the subregion gating transistors are located between the first gating signal line and the driving-voltage signal line; and the signal gating transistors are located between the reference-voltage signal line and the first gating signal line.

5. The grid-driving-circuit array according to claim 4, wherein the subregion gating transistors and the signal gating transistors in each of the frame-starting-up-signal outputting units are arranged correspondingly in the column direction.

6. The grid-driving-circuit array according to claim 4, wherein the subregion gating transistors in each of the frame-starting-up-signal outputting units are arranged sequentially side by side in the row direction; and the signal gating transistors in each of the frame-starting-up-signal outputting units are arranged sequentially side by side in the row direction.

7. The grid-driving-circuit array according to claim 4, wherein a reference-voltage-signal switching line and a first gating-signal switching line are provided on the substrate;

the reference-voltage-signal switching line and the first gating-signal switching line extend in the column direction, and the reference-voltage-signal switching line and the first gating-signal switching line are separated in the row direction;

the reference-voltage-signal switching line is electrically connected to the reference-voltage signal line; and the first gating-signal switching line is electrically connected to the first gating signal line.

8. The grid-driving-circuit array according to claim 4, wherein the substrate further comprises a first conductive layer, an inter-layer insulating layer and a second conductive layer that are sequentially arranged in a direction away from the substrate;

the control electrodes of the signal gating transistors, the control electrodes of the subregion gating transistors, the reference-voltage signal line and the first gating signal line are located at the first conductive layer;

the driving-voltage signal line, the reference-voltage-signal switching line and the first gating-signal switching line are located at the second conductive layer;

the reference-voltage-signal switching line is electrically connected to the reference-voltage signal line by a first connecting via hole penetrating the inter-layer insulating layer;

the first gating-signal switching line is electrically connected to the first gating signal line by a second connecting via hole penetrating the inter-layer insulating layer;

the driving-voltage signal line is electrically connected to the first electrode of the subregion gating transistor by a third connecting via hole penetrating the inter-layer insulating layer; and the first electrodes of the subregion gating transistors are connected to the independent third connecting via holes.

9. The grid-driving-circuit array according to claim 8, wherein the first conductive layer further comprises second gating-signal switching terminals, and the second gating-signal switching terminals are configured for connecting the control electrodes of the subregion gating transistors to the independent second gating-signal switching terminals, respectively.

10. The grid-driving-circuit array according to claim 8, wherein the second conductive layer further comprises frame-starting-up-signal switching lines;

the frame-starting-up-signal switching lines are individually connected to a frame-starting-up-signal terminal of the grid driving circuit corresponding thereto;

the frame-starting-up-signal switching lines extend in the column direction, and the frame-starting-up-signal switching lines are arranged in parallel in the row direction;

the frame-starting-up-signal switching lines are connected to the second electrodes of the signal gating transistors by fourth connecting via holes penetrating the inter-layer insulating layer, and the second electrodes of the signal gating transistors are electrically connected to the frame-starting-up-signal switching lines by the independent fourth connecting via holes; and the frame-starting-up-signal switching lines are connected to the second electrodes of the subregion gating transistors by fifth connecting via holes penetrating the inter-layer insulating layer, and the second electrodes of the subregion gating transistors are electrically connected to the frame-starting-up-signal switching lines by the independent fifth connecting via holes.

11. A display panel, wherein the display panel comprises the grid-driving-circuit array according to claim 1.

12. A grid-driving-circuit array, wherein the grid-driving-circuit array is applied to a display panel, the display panel is delimited into a plurality of active areas, and each of the active areas comprises multiple rows of pixel units and multiple rows of grid lines; and the grid-driving-circuit array comprises:

multiple groups of grid driving units, wherein the multiple groups of grid driving units supply grid driving signals to the plurality of active areas, and each of the groups of grid driving units comprises one or more grid driving circuits; and the one or more grid driving circuits are configured for supplying the grid driving signals to the grid lines within the active area corresponding to the one or more grid driving circuits; and one or more multiplexers, wherein each of the multiplexers comprises a plurality of frame-starting-up-signal outputting units, each of the frame-starting-up-signal outputting units of the multiplexer is configured for supplying a frame starting-up signal to one of the grid driving circuits, and the frame starting-up signals of different grid driving circuits in each of the groups of the grid driving units are supplied by the frame-starting-up-signal outputting units in different multiplexers, wherein each of the grid driving circuits comprises shift registers that are cascaded;

each of the shift registers comprises an initializing unit, a controlling unit, a cascading unit, an outputting unit, a feedback unit and a voltage regulating unit;

the initializing unit is configured for receiving an initializing signal, and initializing a voltage of a first node;

the controlling unit is configured for, under controlling by the frame starting-up signals and a first level signal, starting-up the shift register, and charging the first node; and under controlling by a resetting signal and a second level signal, resetting the shift register;

the outputting unit is configured for, under controlling by the voltage of the first node and a first clock signal, outputting the grid driving signals;

the cascading unit is configured for, under controlling by the voltage of the first node and a second clock signal, outputting a cascading signal;

the feedback unit is configured for, when the shift register is outputting, under controlling by the voltage of the first node, discharging a second node; and after the outputting of the shift register is completed, under controlling by a third clock signal, charging the second node; and the voltage regulating unit is configured for regulating the voltage of the first node and a voltage of the second node.

13. The grid-driving-circuit array according to claim 12, wherein the controlling unit comprises a first transistor and a second transistor;

a control electrode of the first transistor is connected to a frame-starting-up-signal terminal, a first electrode is connected to a first level-signal terminal, and a second electrode is connected to a second electrode of the second transistor and the first node; and a control electrode of the second transistor is connected to a resetting-signal terminal, and a first electrode is connected to a second level-signal terminal.

14. The grid-driving-circuit array according to claim 12, wherein the initializing unit comprises a third transistor, a control electrode of the third transistor is connected to an initializing-signal terminal, a first electrode is connected to the first node, and a second electrode is connected to a common-voltage terminal.

15. The grid-driving-circuit array according to claim 12, wherein the feedback unit comprises a fourth transistor and a fifth transistor, a first electrode and a control electrode of the fourth transistor are connected to a second clock-signal terminal, and a second electrode of the fourth transistor is connected to the second node and a first electrode of the fifth transistor; and a control electrode of the fifth transistor is connected to the first node, and a second electrode of the fifth transistor is connected to the common-voltage terminal.

16. The grid-driving-circuit array according to claim 12, wherein the voltage regulating unit comprises a first-node discharging unit and a second-node discharging unit;

the first-node discharging unit, after outputting of the shift register is completed, under controlling by the voltage of the second node, discharges the first node; and the second-node discharging unit, when the shift register is outputting, discharges the second node.

17. The grid-driving-circuit array according to claim 16, wherein the first-node discharging unit comprises a sixth transistor, a control electrode of the sixth transistor is connected to the second node, the second electrode of the fourth transistor and the first electrode of the fifth transistor; a first electrode of the sixth transistor is connected to the first node, and a second electrode of the sixth transistor is connected to a common-voltage terminal; and the second-node discharging unit comprises a seventh transistor, a control electrode of the seventh transistor is connected to a cascading-signal terminal, a first electrode of the seventh transistor is connected to the common-voltage terminal, and a second electrode of the seventh transistor is connected to the second node.

18. The grid-driving-circuit array according to claim 12, wherein the cascading unit comprises an eighth transistor and a ninth transistor;

a control electrode of the eighth transistor is connected to the first node, a first electrode of the eighth transistor is connected to the second clock-signal terminal, and a second electrode of the eighth transistor is connected to a first electrode of the ninth transistor;

a control electrode of the ninth transistor is connected to the second node, and a second electrode of the ninth transistor is connected to a common-voltage terminal; and a connection point of the second electrode of the eighth transistor and the first electrode of the ninth transistor is used as a cascading-signal terminal of the shift register.

19. The grid-driving-circuit array according to claim 12, wherein the outputting unit comprises a tenth transistor, an eleventh transistor and a first storage capacitor;

a control electrode of the tenth transistor is connected to the first node and a first electrode of the first storage capacitor, a first electrode of the tenth transistor is connected to a first clock-signal terminal, and a second electrode of the tenth transistor is connected to a first electrode of the eleventh transistor and a second electrode of the first storage capacitor;

a control electrode of the eleventh transistor is connected to the second node, and a second electrode of the eleventh transistor is connected to a common-voltage terminal; and a connection point of a second electrode of the tenth transistor, a first electrode of the eleventh transistor and a second electrode of the first storage capacitor is used as a grid-driving-signal terminal of the shift register.

* * * * *